United States Patent
Ochiai et al.

(10) Patent No.: US 9,336,899 B2
(45) Date of Patent: May 10, 2016

(54) BIDIRECTIONAL SHIFT REGISTER AND IMAGE DISPLAY DEVICE USING THE SAME

(75) Inventors: Takahiro Ochiai, Chiba (JP); Mitsuru Goto, Chiba (JP); Hiroyuki Higashijima, Konosu (JP); Yoshihiro Kotani, Chiba (JP); Shuuichirou Matsumoto, Mobara (JP)

(73) Assignee: Japan Display Inc., Tokyo (JP)

( * ) Notice: Subject to any disclaimer, the term of this patent is extended or adjusted under 35 U.S.C. 154(b) by 646 days.

(21) Appl. No.: 13/334,280

(22) Filed: Dec. 22, 2011

(65) Prior Publication Data

US 2012/0162170 A1 Jun. 28, 2012

(30) Foreign Application Priority Data

Dec. 28, 2010 (JP) ................................ 2010-293639

(51) Int. Cl.
  *G09G 3/34* (2006.01)
  *G11C 19/28* (2006.01)
  *G09G 3/36* (2006.01)

(52) U.S. Cl.
  CPC ............ *G11C 19/287* (2013.01); *G09G 3/3677* (2013.01); *G09G 2310/0286* (2013.01)

(58) Field of Classification Search
  CPC ................. G09G 3/36; G09G 3/3677; G09G 2310/0283; G09G 2310/0286; G09G 3/3674; G02F 1/133; G11C 19/00; G11C 19/188; G11C 19/287
  USPC ........... 345/100, 205, 212; 377/64, 68, 69, 74
  See application file for complete search history.

(56) References Cited

U.S. PATENT DOCUMENTS

| | | | | |
|---|---|---|---|---|
| 5,859,630 A | * | 1/1999 | Huq | 345/100 |
| 7,106,292 B2 | | 9/2006 | Moon | |
| 7,436,923 B2 | * | 10/2008 | Tobita | 377/64 |
| 2004/0150610 A1 | * | 8/2004 | Zebedee et al. | 345/100 |
| 2006/0262074 A1 | * | 11/2006 | Shimoda | 345/100 |
| 2007/0274433 A1 | * | 11/2007 | Tobita | 377/64 |
| 2009/0122951 A1 | * | 5/2009 | Tobita | 377/68 |
| 2010/0201666 A1 | * | 8/2010 | Tobita | 345/208 |
| 2010/0220082 A1 | * | 9/2010 | Lin et al. | 345/205 |
| 2011/0157145 A1 | * | 6/2011 | Toyoshima et al. | 345/212 |

FOREIGN PATENT DOCUMENTS

| | | |
|---|---|---|
| JP | 2004-157508 | 6/2004 |
| JP | 2009-272037 | 11/2009 |

* cited by examiner

*Primary Examiner* — Kent Chang
*Assistant Examiner* — Herbert L Hagemeier
(74) *Attorney, Agent, or Firm* — Typha IP LLC

(57) ABSTRACT

A bidirectional shift register capable of performing a stable shift operation in both directions and an image display device using the same are provided. In forward shift operation, when reference point N1 is at H level, (n+4)-th unit register circuit as a rear stage of the bidirectional shift register outputs pulse G(n+4) in synchronization with clock pulse V (n+4) inputted to (n+4)-th unit register circuit. A backward direction trigger signal VSTB is generated not only at the time of start of backward shift, but also, for example, in period (time t4 to t5) of one-phase clock immediately after G(n+4) is outputted in vertical blanking interval of the forward shift. The backward direction trigger signal VSTB is inputted to gate of a transistor provided to set reference point N1 of (n+4)-th unit register circuit to H level at the time of start of the backward shift.

9 Claims, 22 Drawing Sheets

BIDIRECTIONAL SHIFT REGISTER AND IMAGE DISPLAY DEVICE USING THE SAME

CROSS-REFERENCE TO RELATED APPLICATION

The present application claims priority from Japanese application JP 2010-293639 filed on Dec. 28, 2010, the content of which is hereby incorporated by reference into this application.

BACKGROUND OF THE INVENTION

1. Field of the Invention

The present invention relates to a bidirectional shift register capable of changing the output sequence of pulses and an image display device using the same to drive each of scanning lines.

2. Description of the Related Art

The improvement in resolution of an image display device is realized by the improvement in arrangement density of pixels of a display part. Along with that, the arrangement pitch of various signal lines to supply signals to pixel circuits becomes narrow. Gate lines provided as scanning lines of pixels are connected to a gate line drive circuit on the side of a display area. The gate line drive circuit includes a shift register to sequentially output voltages, which enable writing of data to the pixel circuits, to the respective scanning lines. Along with the increase in resolution, the reduction of a unit register circuit constituting each stage of the shift register is also required.

In general, voltages to the gate lines are applied in a single direction (forward direction) and in the sequence from the upper to the lower side of an image correspondingly to the input sequence of image data in a vertical scanning direction. If the shift register can be driven in both directions (not only in a forward direction but also in a backward direction), the input image data can be written to the pixel circuits in the sequence of scanning lines from the lower to the upper side. By this, as compared with a structure in which a frame memory or the like for buffering image data is provided and the sequence of the image data is changed there, the direction of the image to be displayed can be changed by a simple structure.

The shift register used in the gate line drive circuit or the like includes a plurality of cascade-connected unit register circuits, and basically, the unit register circuits at respective stages sequentially output a pulse once from one end to the other end of the column of the unit register circuits in synchronization with vertical scanning or the like.

FIG. 17 is a circuit view showing a basic structure of a unit register circuit (see JP 2004-157508A). An output transistor M1 is connected between an output terminal (GOUT[n]) of an n-th unit register circuit and a clock signal source CK. Besides, a transistor M2 is connected between the terminal (GOUT[n]) and a power source VOFF. FIG. 18 is a signal waveform view for explaining the operation of the unit register circuit (see JP 2009-272037A). When an output pulse GOUT[n−1] of the preceding stage is inputted to the unit register circuit, a node N3 (one end of a capacitor C) connected to the gate of M1 is connected to a power source VON, and the potential at the node N3 is raised to a High (H) level which is a potential to turn on the transistor. Besides, when N3 is at the H level, a node N4 is connected to the power source VOFF, and is set to a Low (L) level which is a potential to turn off the transistor, and M2 is placed in the off state. In this way, the unit register circuit is placed in the set state, and when the clock signal CKV (CK) changes from the L level to the H level, the potential at N3 is further raised through the capacitor C connected between the source and the gate of M1, and the H level of the clock signal CKV appears at the output GOUT[n].

On the other hand, when the clock signal CKV changes from the H level to the L level, the potential at N3 is reduced, and the voltage of the output GOUT [n] is also reduced. At this time, a pulse is generated at the latter stage output signal GOUT[n+1] in synchronization with the rise of the clock signal CKVB to the (n+1)-th stage, and is inputted to the n-th unit register circuit. The pulse of GOUT[n+1] decreases the potential at N3 and raises the potential at N4 to place M2 in the on state, and the output terminal is connected to VOFF. By these operations, the output of the pulse of the output signal GOUT[n] is ended.

SUMMARY OF THE INVENTION

In order to realize bidirectional driving, both a structure used at the time of forward direction driving and a structure used at the time of backward direction driving are provided in a unit register circuit, and a switch element to change those is incorporated in the unit register circuit.

However, when the bidirectional shift register adopting the unit register circuit as stated above is continuously driven in one direction, the threshold voltage of the switch element shifts in the negative direction, and the operation can become unstable.

The invention is made to solve the above problem, and it is an object thereof to provide a bidirectional shift register capable of performing a stable shift operation in both directions and an image display device using the same.

In order to solve the above problem, a bidirectional shift register of the invention includes a shift register part that includes N (N is an integer of 6 or more) cascade-connected unit register circuits and outputs an output pulse G(k) of a k-th unit register circuit (k for integers of 1≤k≤N) in a shift sequence of one of a forward direction and a backward direction, a clock signal generation part that supplies M-phase (M is an integer of 3 or more) clock pulses to the respective unit register circuits of the shift register part sequentially in the forward direction at a time of a forward shift operation of the shift register part or sequentially in the backward direction at a time of a backward shift operation, and a trigger signal generation part that generates a forward direction trigger signal at a time of start of the forward shift and in a vertical blanking interval of the backward shift, and generates a backward direction trigger signal at a time of start of the backward shift and in a vertical blanking interval of the forward shift. The k-th unit register circuit includes a forward direction set terminal, a backward direction set terminal, a forward direction reset terminal, a backward direction reset terminal, a set circuit to set a potential at a reference point to a first potential when a set signal is inputted to one of the set terminals, a reset circuit to set the potential at the reference point to a second potential when a reset signal is inputted to one of the reset terminals, and an output circuit to output the output pulse G(k) in synchronization with the inputted clock pulse in a state where the reference point is at the first potential. When αf, αb, βf and βb are natural numbers, and αf<βb<M and αb<βf<M are established, in the set circuit of the k-th unit register circuit, an output pulse G(k−αf) (k>αf) or the forward direction trigger signal (k≤αf) is inputted as the set signal to the forward direction set terminal, while an output pulse G(k+αb) (k≤N−αb) or the backward direction trigger signal (k>N−αb) is inputted as the set signal to the backward direction set terminal. In the reset circuit of the k-th unit register circuit, an output pulse G(k+βf) (k≤N−βf) or the forward direction trigger signal (k>N−βf) is inputted as the reset signal to the forward direction reset terminal, while an output pulse G(k−βb) (k>βb) or the backward direction trigger signal (k≤βb) is inputted as the reset signal to the backward direction reset terminal.

According to an aspect of the invention, the trigger signal generation part generates the backward direction trigger signal in a period of βf-phase clocks immediately after the output pulse G(N) is outputted at the time of the forward shift operation, and generates the forward direction trigger signal in a period of βb-phase clocks immediately after the output pulse G(1) is outputted at the time of the backward shift operation.

According to another aspect of the invention, the trigger signal generation part generates the backward direction trigger signal in a period of αf-phase clocks immediately before the output pulse G(N) is outputted at the time of the forward shift operation, and generates the forward direction trigger signal in a period of αb-phase clocks immediately before the output pulse G(1) is outputted at the time of the backward shift operation.

According to another aspect of the invention, a potential of the forward direction trigger signal and a potential of the backward direction trigger signal are higher than a potential of the clock pulse.

According to another aspect of the invention, the set circuit of the k-th unit register circuit includes a first forward direction switch that is turned on when the set signal is inputted to the forward direction set terminal and sets the potential at the reference point to the first potential, and a first backward direction switch that is turned on when the set signal is inputted to the backward direction set terminal and sets the potential at the reference point to the first potential, and the reset circuit of the k-th unit register circuit includes a second forward direction switch that is turned on when the reset signal is inputted to the forward direction reset terminal and sets the potential at the reference point to the second potential, and a second backward direction switch that is turned on when the reset signal is inputted to the backward direction reset terminal and sets the potential at the reference point to the second potential According to another aspect of the invention, the first forward direction switch included in the set circuit of the first unit register circuit to the αf-th unit register circuit is a double-gate structure transistor in which a gate terminal is connected to the forward direction set terminal, the second backward direction switch included in the reset circuit of the first unit register circuit to the βb-th unit register circuit is a double-gate structure transistor in which a gate terminal is connected to the backward direction reset terminal, the first backward direction switch included in the set circuit of the (N−αb+1)-th unit register circuit to the N-th unit register circuit is a double-gate structure transistor in which a gate terminal is connected to the backward direction set terminal, and the second forward direction switch included in the reset circuit of the (N−βf+1)-th unit register circuit to the N-th unit register circuit is a double-gate structure transistor in which a gate terminal is connected to the forward direction reset terminal.

According to another aspect of the invention, the trigger signal generation part generates a forward direction auxiliary trigger signal at the time of start of the forward shift and a predetermined timing at the time of the backward shift operation, and generates a backward auxiliary trigger signal at the time of start of the backward shift and a predetermined timing at the time of the forward shift operation. The first forward direction switch included in the set circuit of the first unit register circuit to the αf-th unit register circuit includes a first forward direction set transistor in which a gate terminal and a drain terminal are connected to the forward direction set terminal, and a second forward direction set transistor in which the forward direction auxiliary trigger signal is inputted to a gate terminal, a drain terminal is connected to a source terminal of the first forward direction set transistor, and a source terminal is connected to the reference point. The second backward direction switch included in the reset circuit of the first unit register circuit to the βb-th unit register circuit includes a first backward direction reset transistor in which the backward direction auxiliary trigger signal is inputted to a gate terminal, and a drain terminal is connected to the reference point, and a second backward direction reset transistor in which a gate terminal is connected to the backward direction reset terminal, a drain terminal is connected to a source terminal of the first backward direction reset transistor, and a source terminal is connected to a power source of the second potential. The first backward direction switch included in the set circuit of the (N−αb+1)-th unit register circuit to the N-th unit register circuit includes a first backward direction set transistor in which a gate terminal and a drain terminal are connected to the backward direction set terminal, and a second backward direction set transistor in which the backward direction auxiliary trigger signal is inputted to a gate terminal, a drain terminal is connected to a source terminal of the first backward direction set transistor, and a source terminal is connected to the reference point. The second forward direction switch included in the reset circuit of the (N−βf+1)-th unit register circuit to the N-th unit register circuit includes a first forward direction reset transistor in which the forward direction auxiliary trigger signal is inputted to a gate terminal, and a drain terminal is connected to the reference point, and a second forward direction reset transistor in which a gate terminal is connected to the forward direction reset terminal, a drain terminal is connected to a source terminal of the first forward direction reset transistor, and a source terminal is connected to the power source of the second potential.

In this aspect of the invention, the first forward direction switch included in the set circuit of the first unit register circuit to the αf-th unit register circuit may further include a switch to set a potential at a node, at which the source terminal of the first forward direction set transistor and the drain terminal of the second forward direction set transistor are connected, to the second potential in response to an output pulse of another unit register circuit. The second backward direction switch included in the reset circuit of the first unit register circuit to the βb-th unit register circuit may further include a switch to set a potential at a node, at which the source terminal of the first backward direction reset transistor and the drain terminal of the second backward direction reset transistor are connected, to the second potential in response to an output pulse of another unit register circuit. The first backward direction switch included in the set circuit of the (N−αb+1)-th unit register circuit to the N-th unit register circuit may further include a switch to set a potential at a node, at which the source terminal of the first backward direction set transistor and the drain terminal of the second backward direction set transistor are connected, to the second potential in response to an output pulse of another unit register circuit. The second forward direction switch included in the reset circuit of the (N−βf+1)-th unit register circuit to the N-th unit register circuit may further include a switch to set a potential at a node, at which the source terminal of the first forward direction reset transistor and the drain terminal of the second forward direction reset transistor are connected, to the second potential in response to an output pulse of another unit register circuit.

According to the invention, an image display device includes a plurality of pixel circuits arranged in a matrix form correspondingly to a plurality of scanning lines, a plurality of gate signal lines that are provided for the respective scanning lines and supply gate signals to control writing of video data to the pixel circuits, and a gate signal line drive circuit that uses the bidirectional shift register, and generates the gate signal to each of the plurality of gate signal lines based on the output pulse outputted from a unit register circuit correlated with the gate signal line among the plurality of unit register circuits of the shift register part.

According to the invention, the bidirectional shift register capable of performing a stable shift operation in both directions and the image display device using the same can be obtained.

DETAILED DESCRIPTION OF THE INVENTION

Hereinafter, embodiments 1 and 2 of the invention will be described with reference to the drawings.

Figure 1:
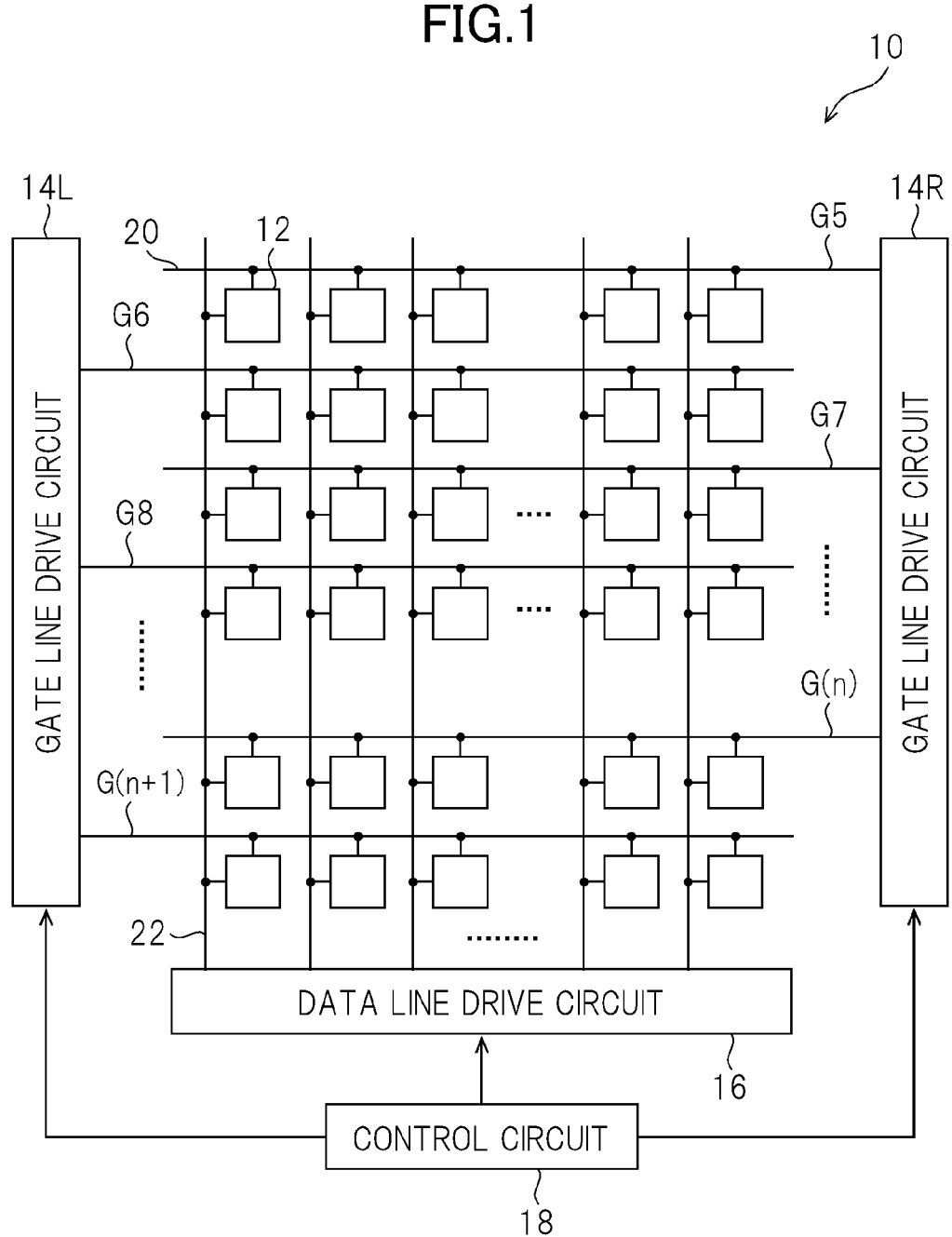
FIG. 1 is a schematic view showing a structure of an image display device of embodiments 1 and 2.

FIG. 1 is a schematic view showing a structure of an image display device 10 of embodiments 1 and 2. The image display device 10 is, for example, a liquid crystal display. The image display device 10 includes a plurality of pixel circuits 12, a gate line drive circuit 14, a data line drive circuit 16 and a control circuit 18.

The pixel circuits 12 are arranged in a matrix form in a display part correspondingly to pixels.

The gate line drive circuit 14 is connected with a plurality of gate signal lines 20. Each of the gate signal lines 20 is connected with the plurality of pixel circuits 12 arranged in the horizontal direction (row direction). The gate line drive circuit 14 sequentially outputs a gate signal to the gate signal lines 20, and enables data to be written to the pixel circuits 12 connected to the relevant gate signal line 20.

The data line drive circuit 16 is connected with a plurality of data lines 22. Each of the data lines 22 is connected with the plurality of pixel circuits 12 arranged in the vertical direction (column direction). The data line drive circuit 16 outputs image data for one scanning line to the data lines 22. The data outputted to the respective data lines 22 are written to the pixel circuits 12 made writable by the gate signal, and each of the pixel circuits 12 controls the amount of light emitted from the pixel in accordance with the written data.

The control circuit 18 controls the operation of the gate line drive circuit 14 and the data line drive circuit 16.

The image display device 10 includes, as the gate line drive circuit 14, a gate line drive circuit 14L arranged on the left side of the display part and a gate line drive circuit 14R arranged on the right side thereof. The gate line drive circuit 14R supplies gate signals to the gate signal lines 20 of odd rows, and the gate line drive circuit 14L supplies the gate signals to the gate signal lines 20 of even rows. The gate line drive circuit 14 and the control circuit 18 constitute the bidirectional shift register, and can change the supply sequence of the gate signals to the gate signal lines 20 between a forward direction from the upper side to the lower side of the display part (direction from the upper to the lower side in FIG. 1) and a backward direction from the lower side to the upper side (direction from the lower to the upper side in FIG. 1).

Figure 2:
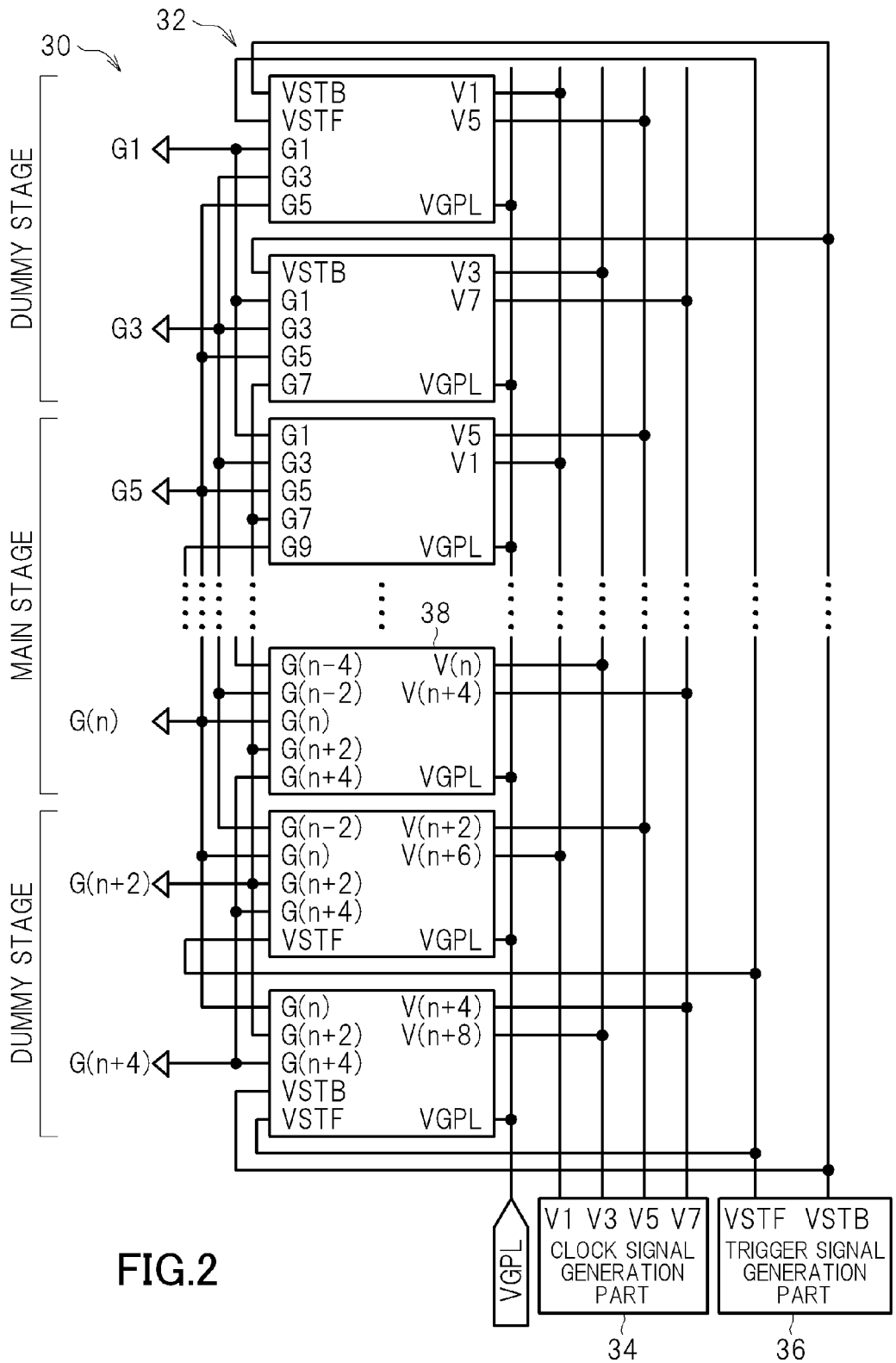
FIG. 2 is a schematic view showing a structure of a bidirectional shift register of embodiments 1 and 2.

FIG. 2 is a schematic view showing a structure of a bidirectional shift register 30 used to scan the gate signal lines 20 of the image display device 10. The bidirectional shift register 30 includes a shift register part 32, a clock signal generation part 34 and a trigger signal generation part 36. The shift register part 32 is provided in the gate line drive circuit 14. The clock signal generation part 34 and the trigger signal generation part 36 are provided in, for example, the control circuit 18. The shift register part 32 includes a plurality of cascade-connected unit register circuits 38.

FIG. 2 shows, as an example, a portion relating to the shift register part 32 provided in the right gate line drive circuit 14R. The gate line drive circuit 14R sequentially drives the gate signal lines 20 of odd rows, that is, at every second row at a timing shifted by 2H (H denotes a horizontal scanning period of one row). On the other hand, the gate line drive circuit 14L sequentially drives the gate signal lines 20 of even rows at a timing shifted by 1H from the odd row. Although the shift register part 32 of the gate line drive circuit 14 on one side is driven by four-phase clocks, as stated above, the driving is such that the phases on both sides are shifted from each other by 1H. Accordingly, the clock signal generation part 34 generates eight-phase clock signals V1 to V8. In each of the clock signals, a pulse with a width of 2H is generated at a period of 8H, and clock signals adjacent in phase, that is, V(j) and V(j+1) (j is a natural number of $1 \leq j \leq 7$) are set to have a phase difference with a period of 1H. That is, the clock pulses adjacent in phase overlap with each other in the period of 1H in the period of 2H in which the H level is kept. The clock signal generation part 34 supplies a first set of V1, V3, V5 and V7, which is a set of signals shifted from each other in phase by 2H, to the gate line drive circuit 14R, and supplies a second set of V2, V4, V6 and V8 to the gate line drive circuit 14L. The unit register circuit 38 at each stage is correlated with one clock signal (output control clock signal) of the phase to determine the timing of the output pulse of the relevant stage (unit register circuit) among the multi-phase clock signals.

The clock signal generation part 34 sequentially generates the clock pulses in the forward direction at the time of a forward shift operation of the shift register part 32, that is, in the sequence of V1, V2, . . . , V8, V1, . . . . On the other hand, the clock signal generation part 34 sequentially generates clock pulses in the backward direction at the time of a backward shift operation, that is, in the sequence of V8, V7, . . . , V1, V8, . . . . The clock signal generation part 34 supplies the generated clock pulses to the respective stages of the shift register 32. For example, at the time of the forward shift operation, the clock signal generation part 34 supplies, as the output control clock signals, the clock signals changed in phase for every stage in the sequence of V1, V3, V5, V7, V1, . . . from the top stage (upper side) to the rear stage (lower side) of the gate line drive circuit 14R. In the gate line drive circuit 14L, the sequence is V2, V4, V6, V8, V2, . . . .

The trigger signal generation part 36 generates a forward direction trigger signal VSTF at the time of start of the forward shift, and generates a backward direction trigger signal VSTB at the time of start of the backward shift. Specifically, a pulse rising to the H level is generated in the signal VSTF at the time of start of the forward shift, and a pulse rising to the H level is generated in the signal VSTB at the time of start of the backward shift. Further, the trigger signal generation part 36 generates the backward direction trigger signal VSTB in a period (vertical blanking interval in the forward shift) between forward shift repetition operations, and generates the forward direction trigger signal VSTF in a period (vertical blanking interval in the backward shift) between backward shift repetition operations (described later).

As already described, the shift register part 32 has the structure in which the plurality of unit register circuits 38 are cascade-connected. Each of the unit register circuits 38 outputs a pulse from its output terminal. The shift register part 32 outputs a pulse in sequence from the top unit register circuit 38 in the forward shift operation, and outputs a pulse in sequence from the rear unit register circuit 38 in the backward shift operation.

As shown in FIG. 2, the plurality of unit register circuits 38 include main stages in which the gate signal line 20 is connected to the output terminal and dummy stages which are added to the top and the rear of the column including the main stages and in which the gate signal line 20 is not connected. The total number of stages of the shift register part 32 is determined according to the number of scanning lines of the image display device 10, that is, the number of the gate signal lines 20 and the number of stages of the top dummy stages and the rear dummy stages. In this embodiment, two dummy stages are provided at each of the top and the rear. When the output of the n-th unit register circuit 38 of the bidirectional shift register 30 is denoted by G(n) (in this embodiment, the last end of the main stages on the side of the gate line drive circuit 14R to drive the gate signal lines 20 of odd rows is the n-th stage), on the side of the gate line drive circuit 14R, the outputs G1, G3, G(n+2) and G(n+4) of the dummy stages are not outputted to the gate signal lines 20, and the outputs G(5), . . . , G(n) of the main stages are outputted to the gate signal lines 20.

Incidentally, on the side of the gate line drive circuit 14L, the outputs G2, G4, G(n+3) and G(n+5) of the dummy stages are not outputted to the gate signal lines 20, and the outputs G(6), . . . , G(n+1) of the main stages are outputted to the gate signal lines 20.

FIG. 2 shows the connection relation of respective input and output terminals of the respective unit register circuits 38. Incidentally, for simplifying notation, a clock signal is denoted by a symbol such as, for example, V(ζ). In this notation, the clock signal V(ζ) in which the phase is denoted by the number ζ exceeding 8 means the clock signal V(ξ) denoted by the remainder ξ obtained when ζ is divided by 8.

Embodiment 1

Figure 3:
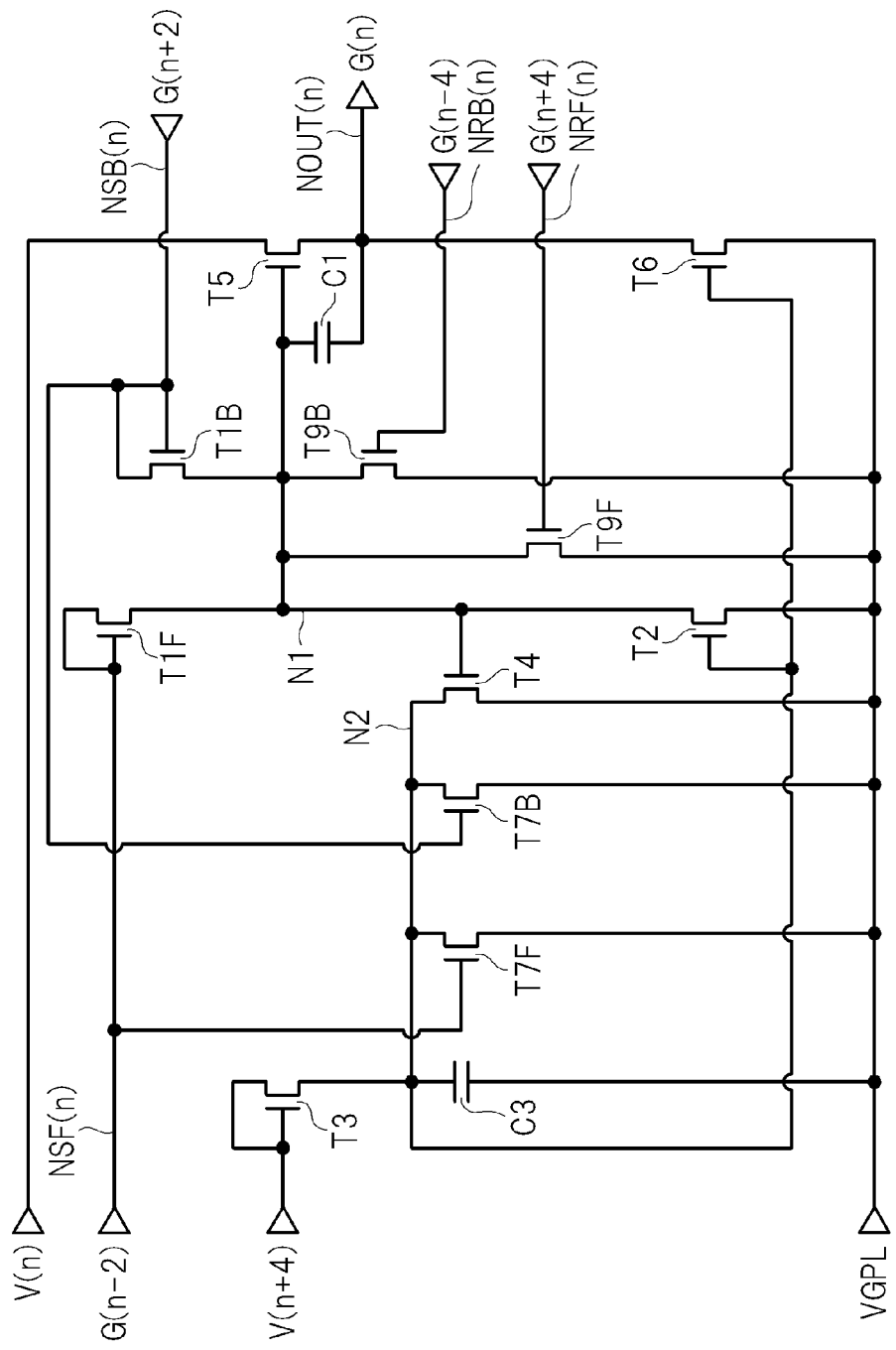
FIG. 3 is a circuit view of an n-th unit register of the bidirectional shift register of embodiment 1.

FIG. 3 is a circuit view of the n-th unit register circuit 38 (on the side of the gate line drive circuit 14R) of the bidirectional shift register 30 of embodiment 1. First, the basic structure of the n-th unit register circuit 38 as the main stage will be described with reference to FIG. 3, and then, the structure of the unit register circuits 38 of the first stage, the third stage, the (n+2)-th stage and the (n+4)-th stage as the dummy stages will be described while attention is mainly given to different points from the basic structure.

The n-th unit register circuit 38 includes n-channel transistors T1F, T1B, T2 to T6, T7F, T7B, T9F and T9B, and capacitors C1 and C3.

The n-th unit register circuit 38 includes an output terminal NOUT(n) to output its own pulse G(n), and includes a forward direction set terminal NSF(n), a backward direction set terminal NSB(n), a forward direction reset terminal NRF(n) and a backward direction reset terminal NRB(n), which are terminals to which pulses of other stages or a trigger signal is inputted. The output signal G(n−2) is inputted from the (n−2)-th stage to the terminal NSF(n) of the main stage, the output signal G(n+2) is inputted from the (n+2)-th stage to the terminal NSB(n), the output signal G(n+4) is inputted from the (n+4)-th stage to the terminal NRF(n), and the output signal G(n−4) is inputted from the (n−4)-th stage to the terminal NRB(n). With respect to the dummy stage, there is a case where there are no output signals of the other corresponding stages, and in that case, a trigger signal is inputted. The dummy stage will be described later in more specifically.

Besides, V(n) and V(n+4) are inputted from the clock signal generation part 34 to the n-th unit register circuit 38.

Further, each of the unit register circuits 38 is supplied with an L level voltage from a power source VGPL.

The drain of the output transistor T5 is connected to the signal line of the output control clock signal V(n), the source thereof is connected to the output terminal NOUT(n), and the conduction of channel is controlled according to the potential at a reference point N1 connected to the gate. The capacitor C1 is connected between the gate and the source of T5. The transistor T5 and the capacitor C1 function as an output circuit to output its own output pulse G(n) in synchronization with the inputted clock signal V(n) in a state where the node N1 as the reference point is at the H level.

Besides, the drain of the transistor T6 is connected to the output terminal NOUT(n), the source thereof is connected to the power source VGPL, and the on and off is controlled according to the potential at a node N2 connected to the gate. The capacitor C3 is connected between the node N2 and the power source VGPL.

The reference point N1 is connected to the terminals NSF(n) and NSB(n) through the diode-connected transistors T1F and T1B respectively. The transistors T1F and T1B function as a set circuit to set the reference point N1 to the H level when an output pulse of another stage is inputted to the terminal NSF(n) or NSB(n).

The transistors T2, T9F and T9B connected between the reference point N1 and the power source VGPL in parallel to each other function as switch elements to turn on and off between N1 and VGPL. The gate of T2 is connected to the node N2, the gate of T9F is connected to the terminal NRF(n), and the gate of T9B is connected to the terminal NRB(n). When the potential at any one of N2, NRF(n) and NRB(n) becomes the H level, the potential at the reference point N1 is set to the L level. Particularly, the transistors T9F and T9B function as a reset circuit to set the reference point N1 to the L level when an output pulse of another stage is inputted to the terminal NRF(n) or NRB(n).

Here, the node N2 is set to the H level in a period other than a period in which the reference point N1 is set to the H level. Since the transistor T2 is turned on in a period in which the node N2 is at the H level, the transistor is in a conduction state for a relatively long time. As a result, a threshold voltage Vth(T2) of the transistor T2 shifts in a positive direction, and the ability of T2 to fix the reference point at the L level is reduced. On the other hand, also in a period other than the set period of the reference point N1 (output period of the n-th stage), the pulse of the clock signal V(n) is applied to the drain of T5, and the pulse serves to raise the potential at N1 through a capacity Cgd between the gate and the drain of T5. Particularly, as described later, at least the size of the transistor T5 of the main stage is required to be increased, and Cgd also becomes large along with that, and the rise of the potential at the reference point N1 also becomes large. Then, T9F and T9B are provided and N1 is suitably reset to the L level.

The node N2 is connected to the signal line of the clock signal V(n+4) through diode-connected T3. When the potential of the clock signal V(n+4) becomes the H level, the transistor T3 sets the potential at the node N2 to the H level. Incidentally, also when the potentials of all clock signals are set to the H level, the potential at the node N2 can be set to the H level.

The transistors T4, T7F and T7B connected between the node N2 and the power source VGPL in parallel to each other function as switch elements to turn on and off between N2 and VGPL. The gate of T4 is connected to N1, the gate of T7F is connected to the terminal NSF(n), and the gate of T7B is connected to the terminal NSB(n). When the potential at any one of N1, NSF(n) and NSB(n) becomes the H level, the potential at the node N2 is set to the L level.

Next, the unit register circuit 38 of the dummy stage will be described. As described above, with respect to the dummy stage, there is a case where there are no output signals of other stages to supply output pulses to the terminals NSF, NSB, NRF and NRB. Specifically, the terminals where there are no output signals from other stages include NSF of the first stage, NRB of the first and the third stage, NSB of the (n+4)-th stage, and NRF of the (n+2)-th and the (n+4)-th stage.

Among these, the set terminals NSF and NSB are used to input signals to set the reference point N1 to the H level as the preparation of generating the output pulse. Then, at the time of start of the forward shift, the pulse of the forward direction trigger signal VSTF is inputted to NSF of the first stage from the trigger signal generation part 36. Besides, at the time of start of the backward shift, the pulse of the backward direction trigger signal VSTB is inputted to NSB of the (n+4)-th stage.

On the other hand, the reset terminals NRF and NRB are used to input signals to reset the reference point N1 to the L level after the output pulse is generated. The reference point N1 is reset to the L level, so that it is avoided that an output pulse is generated by the pulse of an output control clock signal inputted thereafter. Here, the output of the dummy stage is not used to drive the gate signal line 20. Besides, the outputs of the (n+2)-th and the (n+4)-th stage, which are the dummy stages after the generation of the output pulses of the main stages is ended in the forward shift, and the outputs of the first and the third stage, which are the dummy stages after the generation of the output pulses of the main stages is ended in the backward shift, are not used as signals to set the reference points N1 of other stages. Accordingly, in the dummy stage operating at the end of each of the shift operations, even if the output pulse is repeatedly generated according to the repetition of the clock pulse, there is no specific problem. Then, it is sufficient if a signal of the H level is inputted to the terminals NRF of the (n+2)-th and the (n+4)-th stage in the forward shift and the terminals NRB of the first and the third stage in the backward shift before the shift operation for the next frame is started, and the reference point N1 of the stage is placed in the reset state. As an example, in this embodiment, the forward direction trigger signal VSTF is inputted to NRF of the (n+2)-th and the (n+4)-th stage, and the backward direction trigger signal VSTB is inputted to NRB of the first and the third stage.

In the main stage, the output terminal NOUT is connected with the gate signal line 20 and the plurality of pixel circuits 12 as the drive object load. The drive object load becomes large according to the increase of the length of the gate signal line 20 due to the enlargement of the screen, and the increase of the number of the pixel circuits 12 connected to the gate signal line 20 due to the increase in resolution. The output transistor T5 of the main stage is required to have the driving ability corresponding to the load, and for example, the gate width (channel width) is designed to be large. For example, T5 of the main stage is designed to have a large channel width of about 5000 μm. On the other hand, since the dummy stage is not connected to the gate signal line 20, the driving ability of the output transistor T5 is set to be lower than that of the main stage. For example, the channel width of T5 of the dummy stage is set to about 500 μm which is ⅒ of the channel width of T5 of the main stage. As stated above, the size of the transistor T5 of the dummy stage is decreased, and the unit register circuit 38 of the dummy stage can be reduced. Besides, the power consumption of the dummy stage is reduced.

In the above, the structure of the gate line drive circuit 14 is described while the right gate line drive circuit 14R to drive the gate signal lines 20 of odd rows is used as an example. The structure of the left gate line drive circuit 14L to drive the gate signal lines 20 of even rows is the same as that on the right side.

Figure 4:
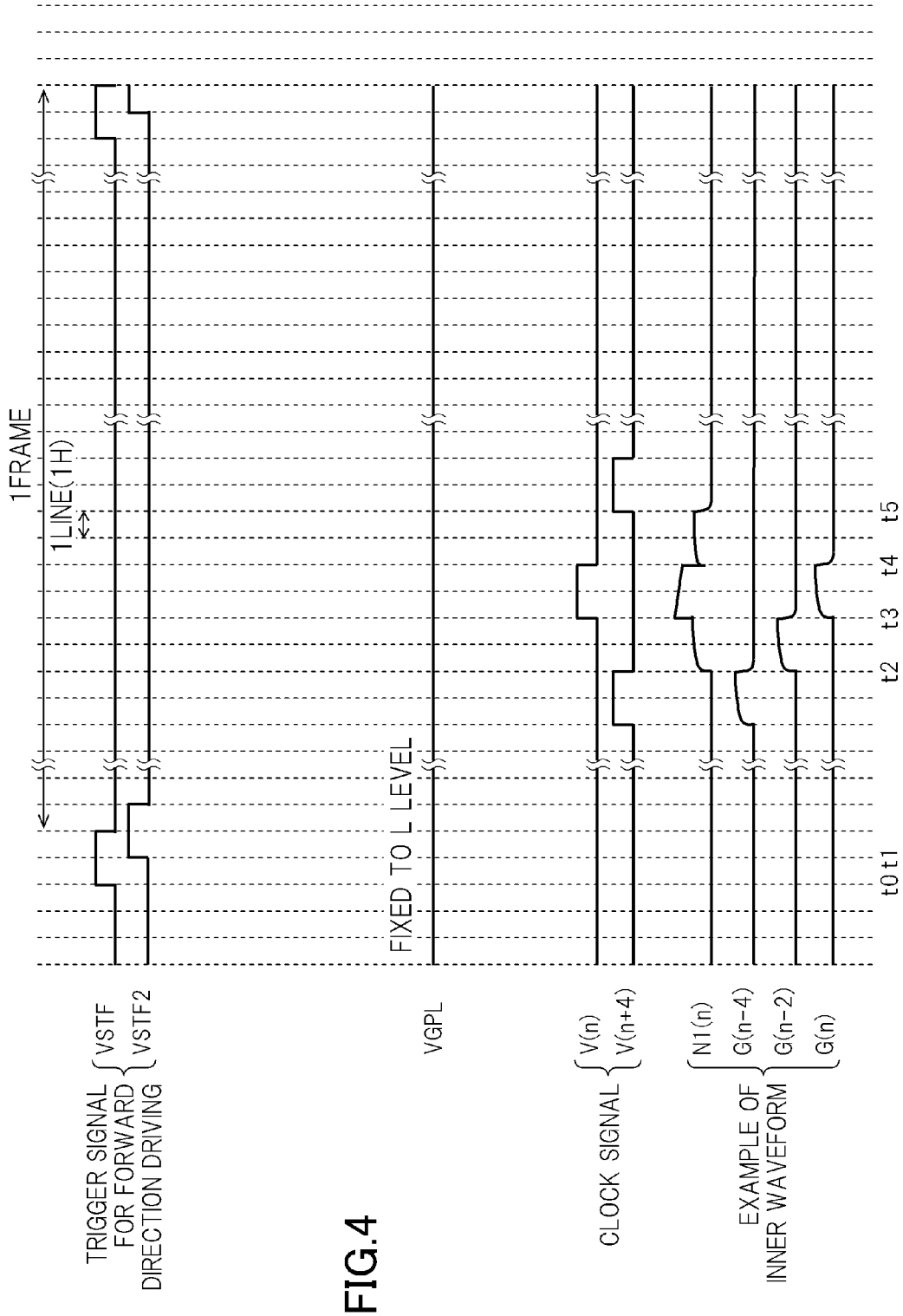
FIG. 4 is a timing view showing an example of various signal waveforms in a forward shift operation of the bidirectional shift register of embodiment 1.

Next, the operation of the bidirectional shift register 30 will be described. FIG. 4 is a timing view showing an example of various signal waveforms in the forward shift operation.

The forward shift starts when the trigger signal generation part 36 generates the pulse of the forward direction trigger signal at the top of the image signal of one frame (time t0, t1). The trigger signal generation part 36 generates the pulse of the forward direction trigger signal VSTF for driving odd rows at time t0, and then generates the pulse of the forward direction trigger signal VSTF2 for driving even rows at time t1 delayed by a period of 1H (time t1). On the other hand, the backward direction trigger signal VSTB for driving odd rows and the backward direction trigger signal VSTB2 for driving even rows are fixed to the L level until the vertical blanking interval of the forward shift.

The clock signal generation part 34 sequentially generates pulses in the forward direction at the time of the forward shift operation as already described. That is, the pulse of the clock signal V(j+1) is raised later than the rise of the pulse of the clock signal V(j) by 1H, and the pulse of the clock signal V1 is raised later than the rise of the pulse of the clock signal V8 by 1H.

Here, first, the forward shift operation of the unit register circuit 38 of the main stage (n-th stage) of the gate line drive circuit 14R will be described.

Before the operation of the n-th stage, the first, third, . . . , n−4)-th and (n−2)-th stage are sequentially operated, and the pulse with a width of 2H is sequentially outputted with a phase difference of 2H. When the pulse of the output signal G(n−2) of the (n−2)-th stage is inputted to the terminal NSF (n) (time t2), the reference point N1 is set to a potential (VGH-Vth(T1F)) corresponding to the H level, T5 is turned on, and the inter-terminal voltage of the capacitor C1 is set to the potential. At this time, T4 is turned on, and the node N2 is set to the L level. Besides, at this time, T7F is also turned on, so that the node N2 is set to the L level more quickly than the case of only T4. The potential at the node n2 is stored in the capacitor C3. Since the node N2 is at the L level, T2 and T6 are in the off state.

The output pulse of the (n−2)-th stage is generated in synchronization with the pulse of the clock V(n−2) (pulse rising earlier than the clock V(n) by 2H), and the pulse of the clock signal V(n) is inputted to the n-th stage at time t3 later than time t2 by 2H. The pulse of the clock signal V(n) raises the source potential of T5. Then, the potential at N1 is further raised by the bootstrap effect, and the pulse of the clock signal V(n) becomes the pulse of the signal G(n) without potential reduction and is outputted from the terminal NOUT(n). The pulse of the signal G(n) is inputted to the terminal NSF of the (n+2)-th stage, and N1 of the stage is set to the H level.

When the pulse of the clock signal V(n) falls at time t4, the pulse of the signal G(n) also falls. On the other hand, the potential at the reference point N1 is kept at the H level.

At the time t4, the (n+2)-th stage outputs the pulse of the signal G(n+2) in synchronization with the clock signal V (n+2). The (n+4)-th stage receiving the pulse output of the (n+2)-th stage outputs the pulse of the signal G(n+4) at time t5 later than time t4 by 2H. As stated above, each stage outputs the pulse of the stage later than the pulse output of the preceding stage by 2H.

When the pulse of the signal G(n+4) is inputted to the terminal NRF of the n-th stage at time t5, T9F is turned on, and the reference point N1 is reset to the L level. At the same time, T3 is also turned on by the clock signal V(n+4), and the node N2 is raised to the H level. As a result, T6 is turned on, and the output terminal NOUT(n) is connected to the power source VGL.

Incidentally, T3 is periodically turned on also at timing other than time t5 by the clock signal V(n+4), and the node N2 is excellently kept at the H level in a period other than the period in which the reference point N1 is placed in the set state. By this, NOUT(n) is kept at the L level in a period other than the period in which the reference point N1 is set to the H level.

By the above operation, the pulse is inputted from the (n−4)-th stage to the terminal NRB (n) in the period of 2H earlier than time t2, and T9B is turned on. However, since the period is before the reference point N1 is set to the H level by the pulse input to the terminal NSF (n) from the (n−2)-th stage, an influence is not given to the foregoing operation. Besides, in the period of 2H from time t4 to time t5, the pulse is inputted from the (n+2)-th stage to the terminal NSB(n), and the potential of the H level is applied from the terminal NSB (n) to the reference point N1 through T1B. However, since the period is before the reference point N1 is reset to the L level by the pulse input to the terminal NRF(n) from the (n+4)-th stage, an influence is not given to the foregoing operation.

Besides, the timing when the reference point N1 is set to the H level is after the pulse earlier than the pulse at time t3 by one period among the plural pulses of the clock signal V(n), and the timing when the reference point N1 is reset to the L level is before the pulse generated after one period. Thus, the pulse output from the terminal NOUT (n) occurs only once in synchronization with the clock pulse at time t3.

As stated above, the main stage receives the output pulse of the stage one stage before its own stage to place the reference point N1 in the set state, and receives the output pulse of the stage two stages after its own stage to place the reference point N1 in the reset state. In this point, the stage one stage before does not exist for the dummy stage of the first stage. Then, as already stated, the first stage is constructed such that the pulse of the forward direction trigger signal VSTF is inputted to the terminal NSF. The first stage receives the pulse of the signal VSTF generated at time t0, and the reference point N1 is set to the H level. The operation of the first stage thereafter is the same as that of the n-th stage described above. Besides, in the dummy stages of the (n+2)-th and the (n+4)-th stage, there is no stage two stages after. Then, as already stated, the (n+2)-th and the (n+4)-th stage are constructed such that the pulse of the forward direction trigger signal VSTF is inputted to the terminal NRF. The reference point N1 of the (n+2)-th and the (n+4)-th stage is set to the H level at the end of the forward shift operation of one frame, and then is reset to the L level by receiving the pulse of the signal VSTF generated at the time of start of the next frame.

In the above, the forward shift operation of each stage of the gate line drive circuit 14R is described. The forward shift operation of each stage of the gate line drive circuit 14L is the same as that of the corresponding stage of the gate line drive circuit 14R. However, the respective stages of the gate line drive circuit 14L perform the respective operations later than the corresponding stage of the gate line drive circuit 14R by 1H.

Figure 5:
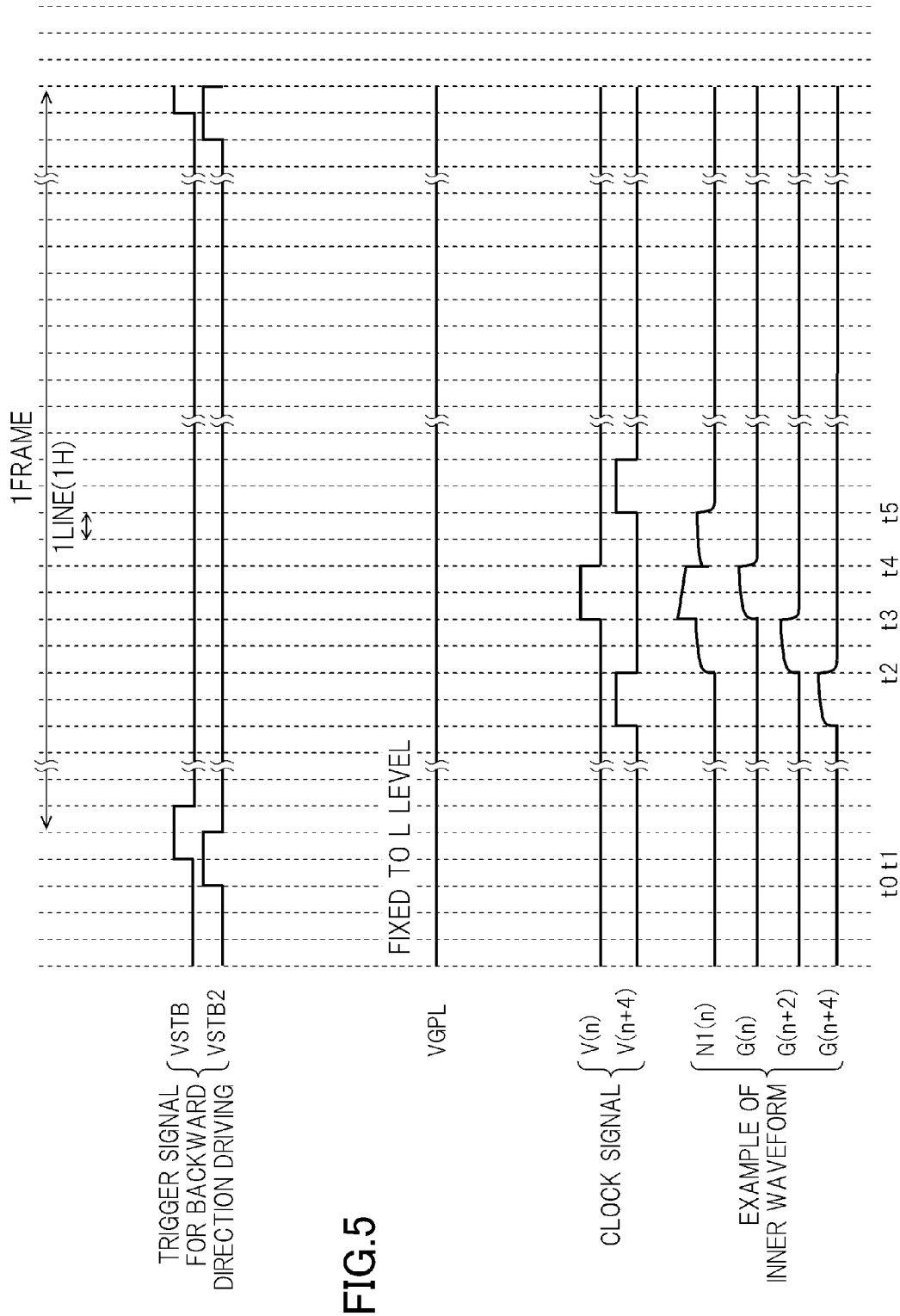
FIG. 5 is a timing view showing an example of various signal waveforms in a backward shift operation of the bidirectional shift register of embodiment 1.

FIG. 5 is a timing chart showing an example of various signal waveforms in the backward shift operation.

The backward shift is started when the trigger signal generation part 36 generates the pulse of the backward direction trigger signal at the top of the image signal of one frame (time t0, t1). The trigger signal generation part 36 generates the pulse of the backward direction trigger signal VSTB2 for driving even rows at time t0, and then generates the pulse of the backward direction trigger signal VSTB for driving odd rows at time t1 delayed by the period of 1H (time t1). On the other hand, the forward direction trigger signal VSTF for driving odd rows and the forward direction trigger signal VSTF2 for driving even rows are fixed to the L level until the vertical blanking interval of the backward shift.

The clock signal generation part 34 sequentially generates pulses in the backward direction at the time of the backward shift operation as already described. That is, the pulse of the clock signal V(j) is raised later than the rise of the pulse of the clock signal V(j+1) by 1H, and the pulse of the clock signal V8 is raised later than the rise of the pulse of the clock signal V1 by 1H.

In the unit register circuit 38 of each stage of the shift register part 32, the circuit structure is such that a portion relating to the terminal NSF and a portion relating to the terminal NSB are symmetrical to each other, and a portion relating to the terminal NRF and a portion relating to the terminal NRB are symmetrical to each other. Specifically, when the number of phases of the four-phase clock used for driving of the gate line drive circuit 14 on one side is considered, in both the forward shift operation and the backward shift operation, the unit register circuit 38 of each stage is constructed such that the reference point N1 is placed in the set state when the terminal NSB receives the output pulse generated earlier than its own stage by one phase of the clock, that is, the period of 2H, and the reference point N1 is placed in the reset state when the terminal NRB receives the output pulse generated later than its own stage by two phases of the clock, that is, 4H. Besides, both ends of the shift register part 32, that is, the top dummy stage and the rear dummy stage are symmetrical to each other with respect to the inversion of the shift direction. Specifically, the top dummy stage in the backward shift operation functions similarly to the rear dummy stage in the forward shift operation, and the rear dummy stage in the backward shift operation functions similarly to the top dummy stage in the forward shift operation. Thus, if the control circuit 18 changes the trigger signal and changes the sequence of generating the clock pulse, the shift register part 32 performs the backward shift operation in the same operation as the forward shift.

For example, in the (n+4)-th stage of the gate line drive circuit 14R, the pulse of the backward direction trigger signal VSTB is inputted to the terminal NSB at time t1, and the reference point N1 is set to the H level, and then, the pulse is generated in the output signal G(n+4) in synchronization with the pulse of the clock signal V(n+4) generated first. After that, pulses are sequentially outputted from the respective stages in the direction opposite to the forward shift operation.

In the above, the backward shift operation is described while the gate line drive circuit 14R is used as an example. The backward shift operation of each stage of the gate line drive circuit 14L is the same as the corresponding stage of the gate line drive circuit 14R. However, the respective stages of the gate line drive circuit 14L perform the respective operations earlier than the corresponding stages of the gate line drive circuit 14R by 1H.

Here, when its own stage is the base point, another stage to input the pulse to the reset terminal NRF is set to the stage farther than another stage to input the pulse to the set terminal NSB, and another stage to input the pulse to the reset terminal NRB is set to the stage farther than another stage to input the pulse to the set terminal NSF. According to this structure, at the time of the forward shift operation, the pulses inputted to the terminals NSB and NRB relating to the backward shift operation do not influence the forward shift operation. Similarly, at the time of the backward shift operation, the pulses inputted to the terminals NSF and NRF relating to the forward shift operation do not influence the backward shift operation. Thus, for example, it is not necessary to provide such a switch that only the inputs of the terminals NSF and NRF are selectively received at the time of the forward shift operation, while only the inputs of the terminals NSB and NRB are selectively received at the time of the backward shift operation. That is, the shift register part 32 and the unit register circuit 38 constituting that can be constructed such that the basic circuit structure is not changed over between the forward shift and the backward shift. Since a transistor used as a changing-over switch is not required, the circuit structure of the unit register circuit 38 becomes simple, and its size can be easily reduced. Besides, signal lines to supply changing-over signals to the transistors of the respective stages are not required to be arranged along the shift register part 32, the increase in size of the gate line drive circuit 14 in the horizontal direction can be suppressed.

Incidentally, as described in the forward shift operation, T3 is turned on by using the clock signal and the node N2 is raised to the H level in synchronization with the operation of resetting the reference point N1. In this embodiment, the clock to drive the gate line drive circuit 14 on one side has four phases, and for example, in the unit register circuit 38 of the n-th stage as the main stage on the side of the gate line drive circuit 14R, the reference point N1 is reset at timing delayed by two phases of the clock from the output control clock signal V(n) to the output transistor T5 of its own stage. The clock signal to turn on T3 at the timing of the reset of the reference point N1 is V(n+4) in the forward shift, and is V(n−4) in the backward shift, and these have the same phase. That is, in this embodiment, the clock signal to control T3 is also not required to be changed over between the forward shift and the backward shift.

In the embodiment, each of the gate line drive circuits 14L and 14R is four-phase driven, the outputs of the (k−2)-th stage, the (k−1)-th stage, the (k+1)-th stage and (k+2)-th stage are basically inputted to the unit register circuit 38 of the k-th stage in each of the gate line drive circuits 14L and 14R, the reference point N1 is set to the H level by the output pulses of the (k−1)th stage and the (k+1)-th stage, and the reference point N1 is reset to the L level by the output pulses of the (k−2)-th stage and the (k+2)-th stage. Consequently, the bidirectional shift register can be realized in which the circuit structure is not basically required to be changed over between the forward shift and the backward shift. Besides, in the structure as stated above, after the output pulse of each stage falls, the H level of the reference point N1 is reset to the L level. That is, after the end of the output pulse of each stage, a subsequent set period is provided in which the reference point N1 of the stage is kept in the set state. Since this subsequent set period exists, the operation of the bidirectional shift register of the invention is not such that the potential at the reference point N1 is abruptly reduced from the potential higher than the H level to the L level, and the transistor T6 is turned on. Thus, an unstable operation due to a timing shift of respective signals or waveform deformation, such as occurrence of a through current, is hard to occur.

Incidentally, no limitation is made to the structure of the above embodiment. In general, a structure may be made such that a clock signal to drive the shift register part 32 has M phases (M is an integer of 3 or more), and when αf, αb, βf and βb are natural numbers of αf<βb<M and αb<βf<M, outputs of (k−βb)-th stage, (k−αf)-th stage, (k+αb)-th stage and (k+βf)-th stage are inputted to the k-th unit register circuit 38, the reference point N1 is set to the H level by output pulses of the (k−αf)-th stage and the (k+αb)-th stage, and the reference point N1 is reset to the L level by output pulses of the (k−βb)-th stage and the (k+βf)-stage. Also in the above structure, the bidirectional shift register as described above can be realized in which changing-over of the circuit structure is not basically required and the operation stability is improved.

Incidentally, from the condition of αf<βb and αb<βf, βf and βb are 2 or more, and from this condition, N is 3 or more. However, as in the embodiment, in the bidirectional shift register in which the dummy stages of the βb stages are provided at the top, and the dummy stages of the βf stages are provided at the rear, at least two stages are required as the main stages in order to perform the forward shift and the backward shift, and accordingly, N is 6 or more.

Incidentally, similarly to the foregoing dummy stage, there is a case where a signal other than an output pulse of another stage is inputted to the terminals NSF, NSB, NRF and NRB of the unit register circuits 38 on both ends of the shift register part 32 in this general case. Specifically, in the bidirectional shift register having N stages, the forward direction trigger signal is inputted to the terminal NSF of the first to the αf-th stage, and the reference point N1 is set to the H level by the signal at the time of start of the forward shift. Besides, the backward direction trigger signal is inputted to the terminal NSB of the (N−αb+1) to the N-th stage, and the reference point N1 is placed in the set state by the signal at the time of start of the backward shift. Besides, the forward direction trigger signal can be used as the reset signal inputted to the terminal NRF of the (N−βf+1)-th to the n-th stage. The backward direction trigger signal can be used as the reset signal inputted to the terminal NRB of the first to the βb-th stage.

The number αf corresponds to "preceding set period" from a time when the reference point N1 is set in the forward shift operation to a time when the output pulse rises, and αb corresponds to "preceding set period" in the backward shift operation (βf corresponds to "subsequent set period" in the forward shift operation, and βb corresponds to "subsequent set period" in the backward shift operation). If the preceding set period becomes long, the potential of N1 kept by the capacitor C1 is reduced by leakage current of T9F or T9B, and there can occur a disadvantage that at the time of input of the clock pulse to the drain of T5, the gate of T5 does not reach a potential sufficient for the pulse output from the terminal NOUT. Then, for example, if the capacity of the capacitor C1 is not very large and there is a fear of the foregoing disadvantage, a structure is preferable in which as in the above embodiment, αf and αb are set to 1, and the preceding set period is made short.

Besides, from the viewpoint that the operations of the image display device 10 in the forward shift operation and the backward shift operation are made symmetrical, αf=αb and βf=βb are preferable.

In the above embodiment of M=4, and βf=βb=2, as stated above, the clock signal used as the control signal of T3 can be made common to the forward shift operation and the backward shift operation. The structure in which the control of T3 is performed by the clock signal common to both directions as stated above is realized when βf+βb=M is established.

Incidentally, in the above embodiment, if the backward direction trigger signal VSTB is fixed to the L level in the forward shift operation, in the forward shift operation, T9B, the gate of which is connected to the backward direction reset terminal NRB of the first to the βb-th stage, is kept in the off state, and T1B and T7B, the gates of which are connected to the backward direction set terminal NSB of the (N−αb+1)-th to the N-th stage, are also kept in the off state. Besides, if the forward direction trigger signal VSTF is fixed to the L level in the backward shift operation, in the backward shift operation, T9F, the gate of which is connected to the forward direction reset terminal NRF of the (N−βf+1)-th to the N-th stage, is kept in the off state, and T1F and T7F, the gates of which are connected to the forward direction set terminal NSF of the first to the αf-th stage, are also kept in the off state.

As stated above, the transistor which is kept in the off state for a long time by application of voltage between the drain and the source can cause a change in transistor characteristic, called Vth shift. Specifically, in the n-channel transistor, the threshold voltage Vth shifts in the negative direction and is reduced, and leakage current is liable to occur. The Vth shift becomes a problem especially in an a-Si thin film transistor (TFT). For example, it is known that when the transistor, which caused the Vth shift, is once turned on and a current flows, the Vth shift can be resolved.

Then, in the driving method of the shift register part 32 in the embodiment, when the forward shift is repeated over a plurality of frames, the trigger signal generation part 36 changes the backward direction trigger signal VSTB for driving odd rows and the backward direction trigger signal VSTB2 for driving even rows to the H level in the period (vertical blanking interval of the forward shift) between the repetition operations, and turns on T1B, T7B and T9B. On the other hand, when the backward shift is repeated, the trigger signal generation part 36 changes the forward direction trigger signal VSTF for driving odd rows and the forward direction trigger signal VSTF2 for driving even rows to the H level in the period (vertical blanking interval of the backward shift) between repetition operations, and turns on T1F, T7F and T9F. By this, in the dummy stage, the reduction of the potential at the reference point N1 due to the leakage of current from T1F, T7F, T9F or T1B, T7B, T9B can be suppressed, and the shift operation of the shift register part 32 can be stabilized.

Here, an example of timing when the backward direction trigger signals VSTB and VSTB2 are changed to the H level at the time of the forward shift operation and an example of timing when the forward direction trigger signals VSTF and VSTF2 are changed to the H level at the time of the backward shift operation will be described with reference to FIG. 6 to FIG. 9.

Figure 6:
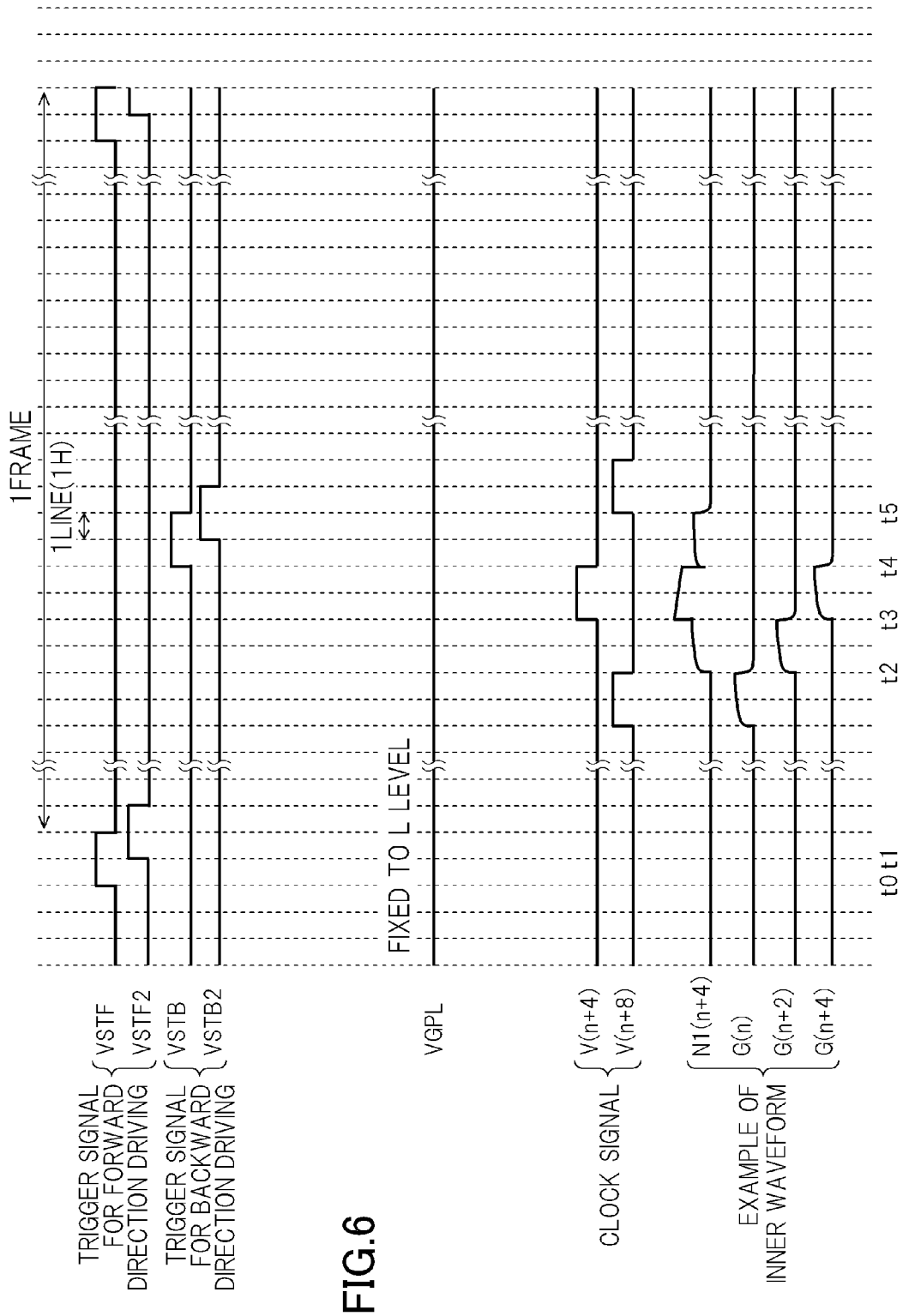
FIG. 6 is a timing view showing an example of various signal waveforms in the forward shift operation of the bidirectional shift register of embodiment 1.
Figure 7:
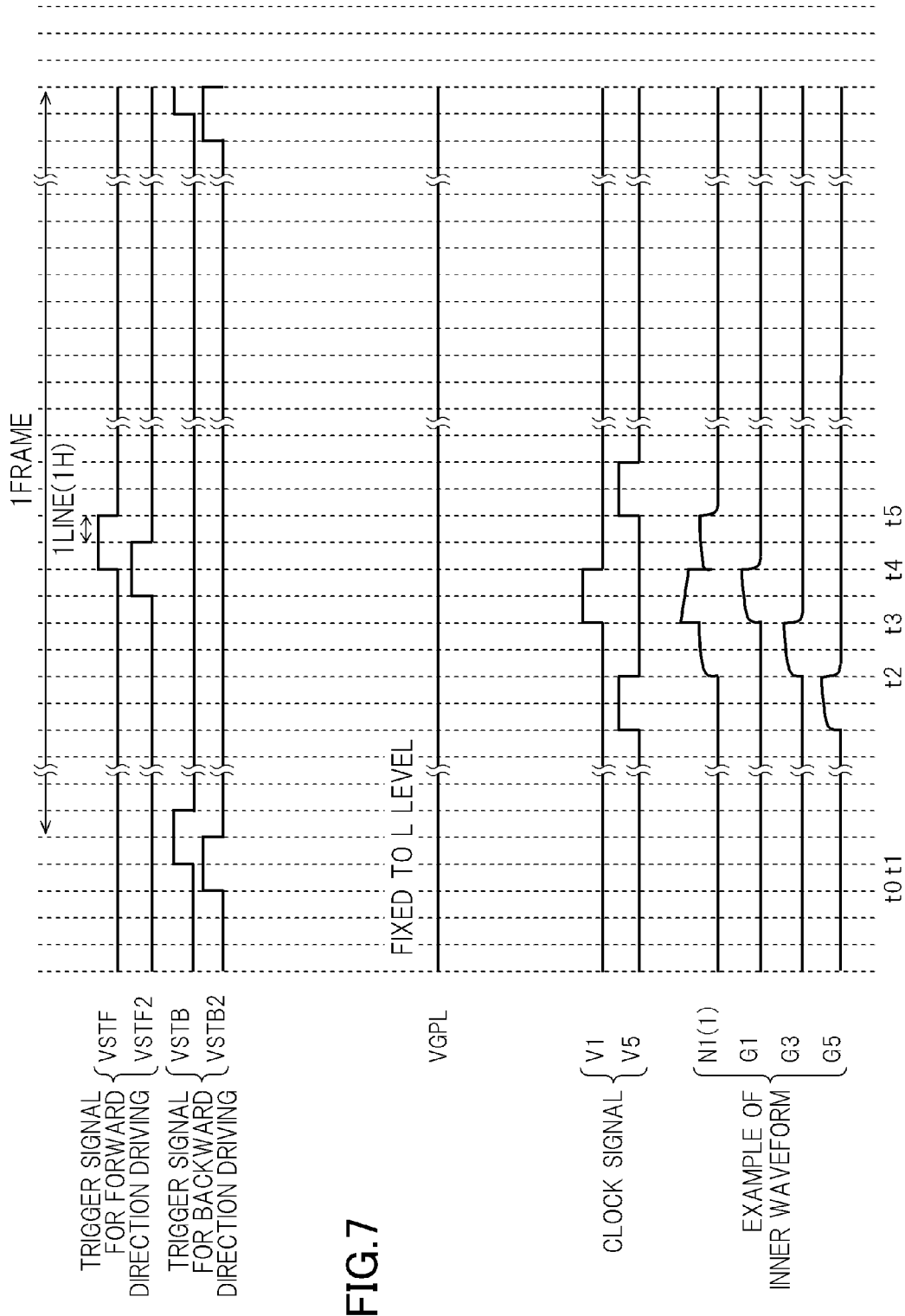
FIG. 7 is a timing view showing an example of various signal waveforms in the backward shift operation of the bidirectional shift register of embodiment 1.

FIG. 6 and FIG. 7 are timing views respectively showing an example of various signal waveforms in the forward shift operation and the backward shift operation. In the forward shift operation, it is desirable that the backward direction trigger signals VSTB and VSTB2 are set to the H level at a timing immediately after the unit register circuit 38 of the rear stage of each of the gate line drive circuits 14R and 14L generates the output pulse. For example, in the gate line drive circuit 14R, if the backward direction trigger signal VSTB is set to the H level in the 2H period (subsequent set period) from time t4 to t5 shown in FIG. 6, the gate potential becomes temporarily (at least at a timing when the potential at the reference point N1 falls) higher than the source-drain potential of T9B of the first and the third stage and T1B and T7B of the (n+4)-th stage. Accordingly, the Vth shift of those can be resolved. The period in which the backward direction trigger signal VSTB is set to the H level is not required to be the whole of the 2H period from time t4 to t5, and may be a period including at least the timing when the potential at the reference point N1 falls. On the other hand, in the backward shift operation, it is desirable that the forward direction trigger signals VSTF and VSTF2 are set to the H level at a timing immediately after the first stage of each of the gate line drive circuits 14R and 14L generates the output pulse. For example, in the gate line drive circuit 14R, if the forward direction trigger signal VSTG is set to the H level in the 2H period (subsequent set period) from time t4 to t5 shown in FIG. 7, the gate potential becomes temporarily (at least at a timing when the potential at the reference point N1 falls) higher than the source-drain potential of T1F and T7F of the first stage and T9F of the (n+2)-th and the (n+4)-th stage. Accordingly, the Vth shift of those can be resolved. The period in which the forward direction trigger signal VSTF is set to the H level is not required to be the whole of the 2H period from time t4 to t5, and may be a period including at least the timing when the potential at the reference point N1 falls.

Figure 8:
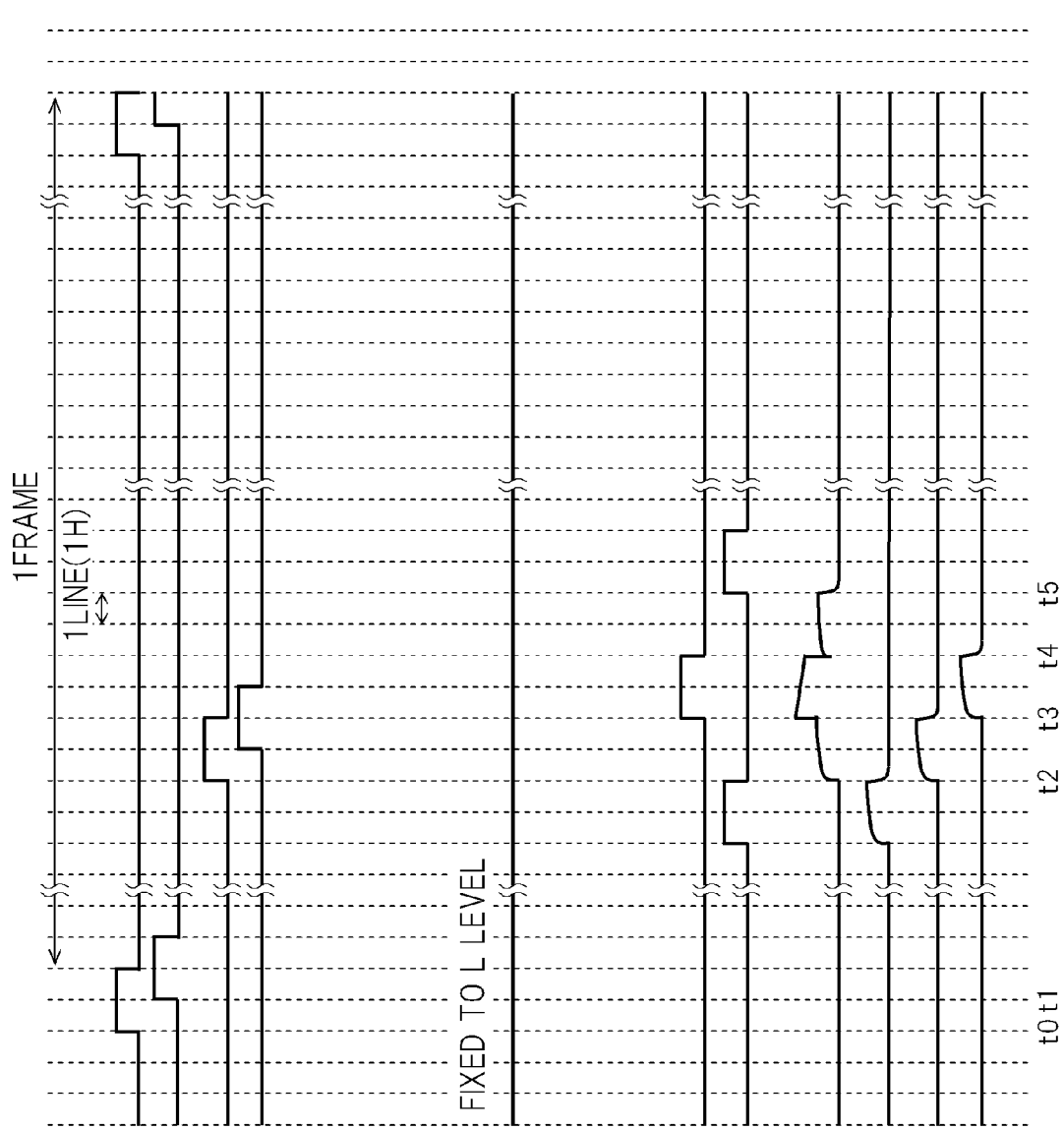
FIG. 8 is a timing view showing another example of various signal waveforms in the forward shift operation of the bidirectional shift register of embodiment 1.
Figure 9:
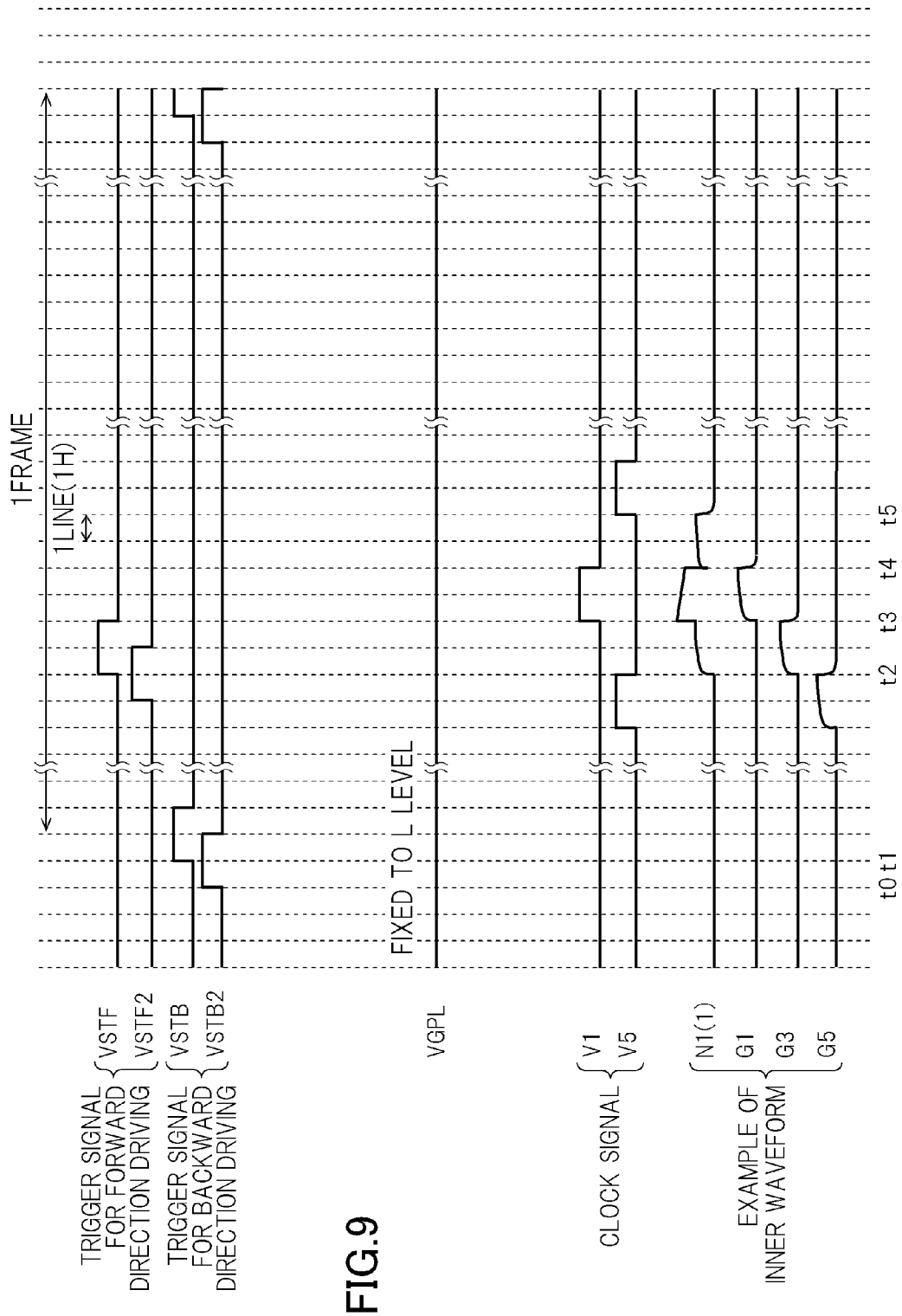
FIG. 9 is a timing view showing another example of various signal waveforms in the backward shift operation of the bidirectional shift register of embodiment 1.

FIG. 8 and FIG. 9 are timing views respectively showing another example of various signal waveforms in the forward shift operation and the backward shift operation. In the forward shift operation, the backward direction trigger signals VSTB and VSTB2 may be set to the H level at a timing immediately before the unit register circuit 38 of the rear stage of each of the gate line drive circuits 14R and 14L generates the output pulse. For example, in the gate line drive circuit 14R, if the backward direction trigger signal VSTB is set to the H level in the 2H period (preceding set period) from time t2 to t3 shown in FIG. 8, the gate potential becomes temporarily (at least at a timing when the potential at the reference point N1 falls) higher than the source-drain potential of T9B of the first and the third stage, and T1B and T7B of the (n+4)-th stage. Accordingly, the Vth shift of those can be resolved. On the other hand, in the backward shift operation, the forward direction trigger signals VSTF and VSTF2 may be set to the H level at a timing immediately before the first stage of each of the gate line drive circuits 14R and 14L generates the output pulse. For example, in the gate line drive circuit 14R, if the forward direction trigger signal VSTF is set to the H level in the 2H period (preceding set period) from time t2 to t3 shown in FIG. 9, the gate potential becomes temporarily (at least at a timing when the potential at the reference point N1 falls) higher than the source-drain potential of T1F and T7F of the first stage, and T9F of the (n+2)-th and the (n+4)-th stage. Accordingly, the Vth shift of those can be resolved.

Figure 10:
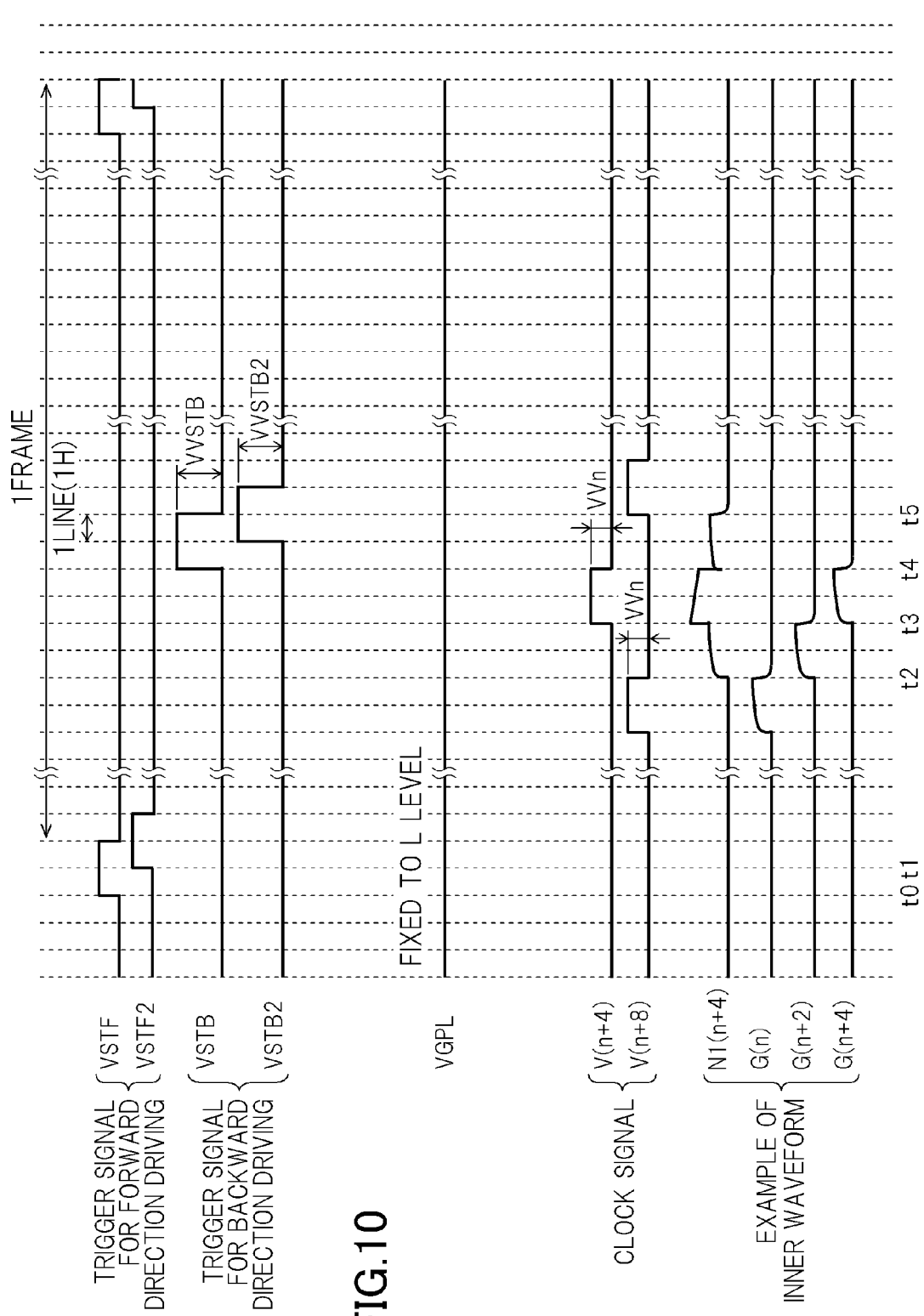
FIG. 10 is a timing view showing another example of various signal waveforms in the forward shift operation of the bidirectional shift register of embodiment 1.
Figure 11:
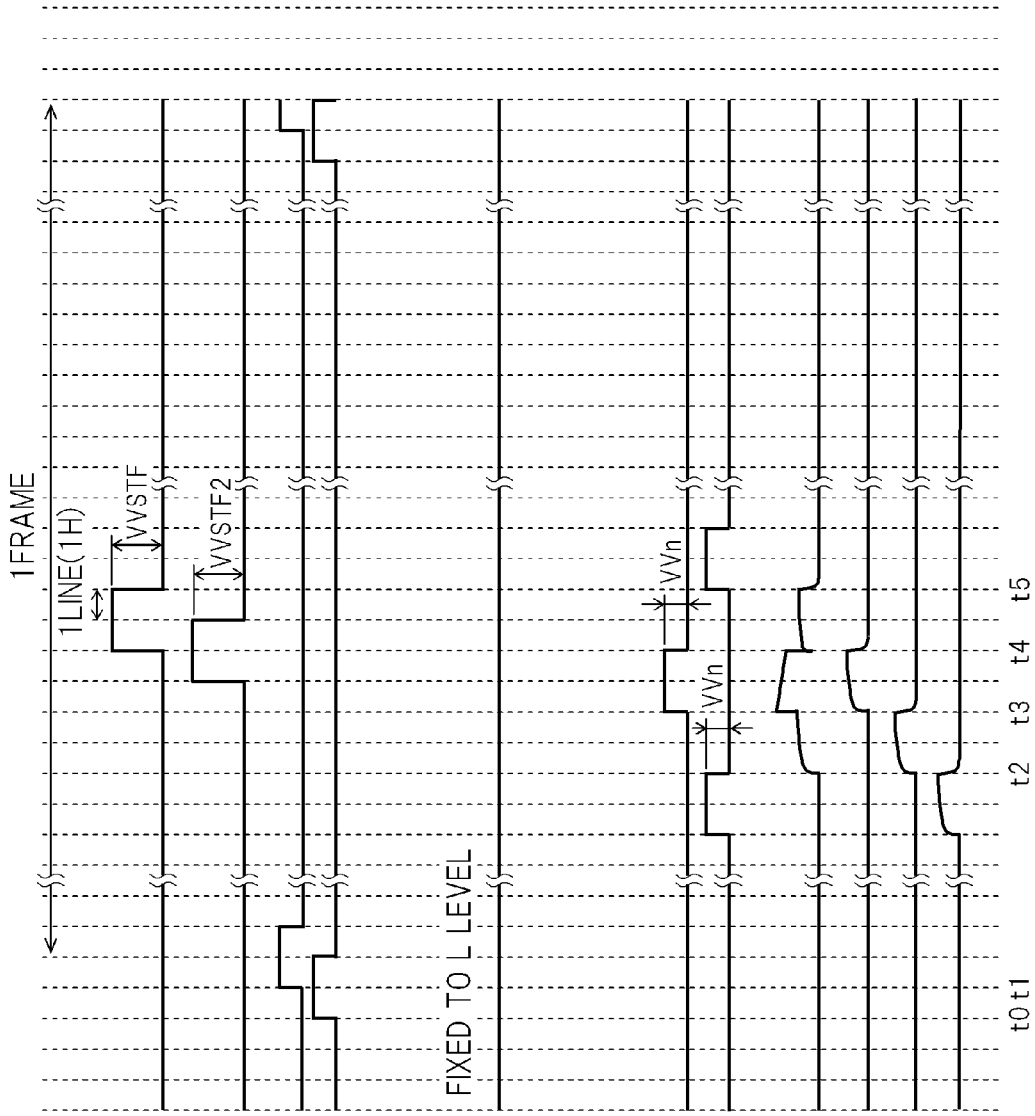
FIG. 11 is a timing view showing another example of various signal waveforms in the backward shift operation of the bidirectional shift register of embodiment 1.

Besides, in the forward shift operation, as shown in FIG. 10, the H level (VVSTB, VVSTB2) of the backward direction trigger signals VSTB and VSTB2 may be made higher than the H level (VVn) of the clock signals V1 to V8. On the other hand, in the backward shift operation, as shown in FIG. 11, the H level (VVSTF, VVSTF2) of the forward direction trigger signals VSTF and VSTF2 may be made higher than the H level (VVn) of the clock signals V1 to V8. Since the potential at the reference point N1 is equal to or lower than the potential of the clock signals V1 to V8 (N1 potential≤preceding stage output potential≤clock signal potential), the Vth shift of T1F, T7F, T9F or T1B, T7B, T9B can be more certainly resolved by this.

Further, the unit register circuit is not limited to one shown in FIG. 3, and may be made to have another circuit structure including a forward direction set terminal NSF, a backward direction set terminal NSB, a forward direction reset terminal NRF, a backward direction reset terminal NRB, a set circuit to set a potential at a reference point to a first potential when a set signal is inputted to one of the terminals NSF and NSB, a reset circuit to set the potential at the reference point to a second potential when a reset signal is inputted to one of the terminals NRF and NRB, and an output circuit to output a pulse in an output signal in synchronization with a clock pulse inputted to the unit register circuit in a state where the reference point is at the first potential. For example, the condition (βf+βb=M) in which T3 can be controlled by the clock signal common to the forward shift and the backward shift is not satisfied, a circuit structure can be adopted which changes the control signal applied to the gate of T3 between the forward shift and the backward shift, and this is also one modified example of the unit register circuit.

Incidentally, in the above embodiment, although the example of using the n-channel transistor as the transistor constituting the bidirectional shift register 30 is described, the transistor may be a p-channel transistor. Besides, the transistor may be a TFT or a MOSFET. A semiconductor layer constituting the transistor may be basically single crystalline silicon, amorphous silicon (a-Si) or polycrystalline silicon (poly-Si), or may be oxide semiconductor such as IGZO (indium gallium zinc oxide).

Embodiment 2

Hereinafter, the same component as that of embodiment 1 is denoted by the same reference numeral, and the explanation already made on the component is used in order to simplify the explanation.

Figure 12A:
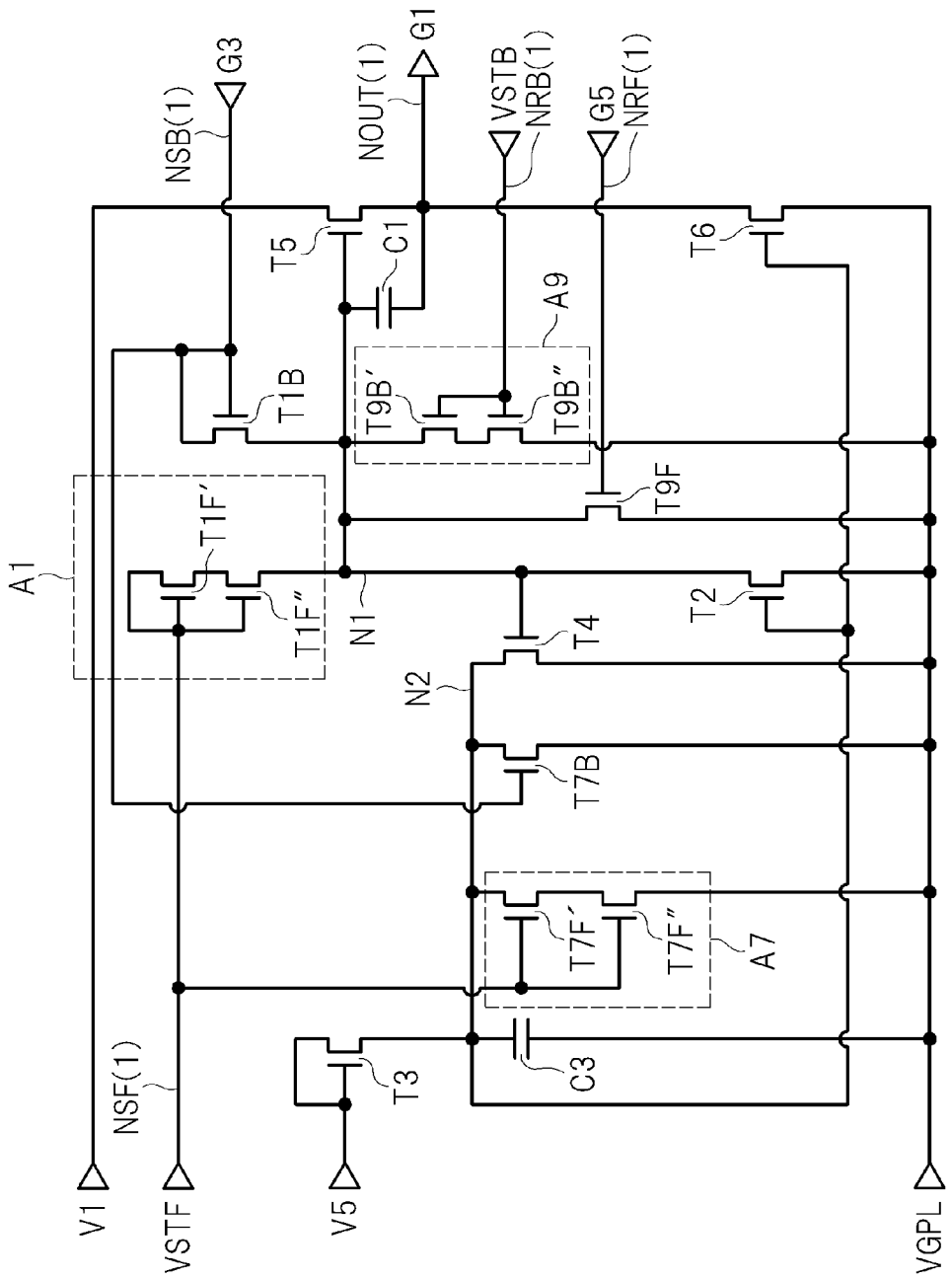
FIG. 12A is a circuit view of a first unit register circuit of the bidirectional shift register of embodiment 2.
Figure 12B:
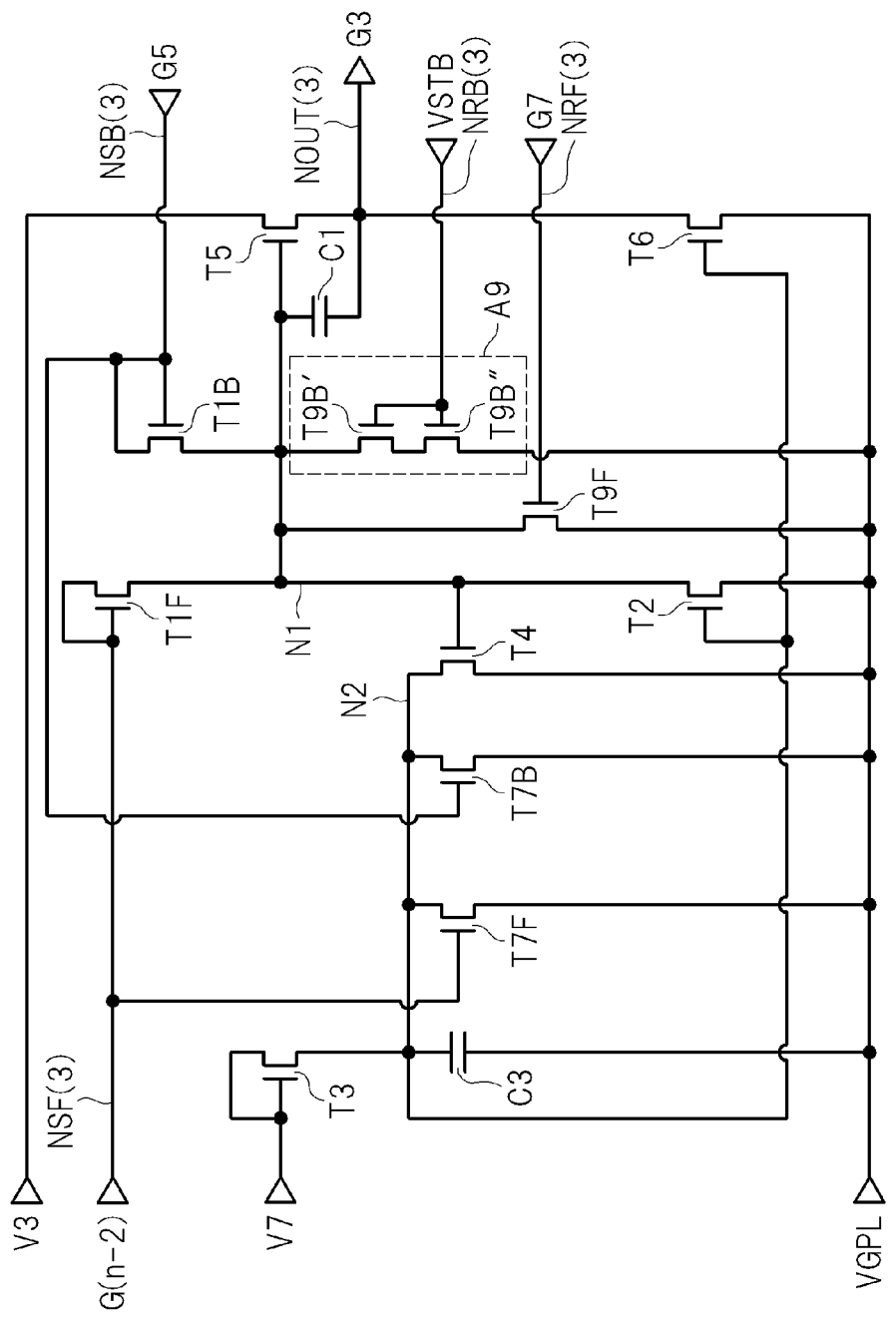
FIG. 12B is a circuit view of a third unit register circuit of the bidirectional shift register of embodiment 2.
Figure 12C:
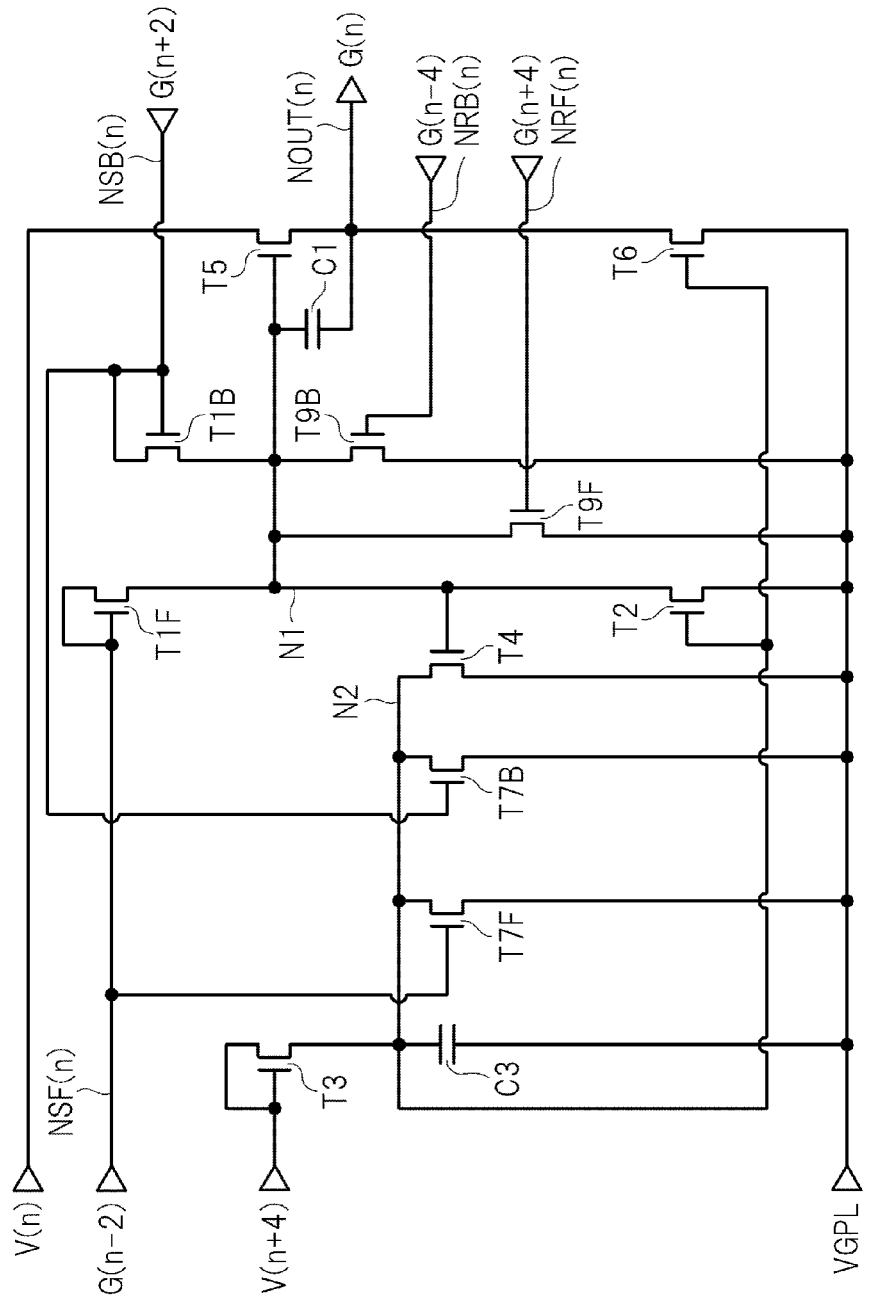
FIG. 12C is a circuit view of an n-th unit register circuit of the bidirectional shift register of embodiment 2.
Figure 12D:
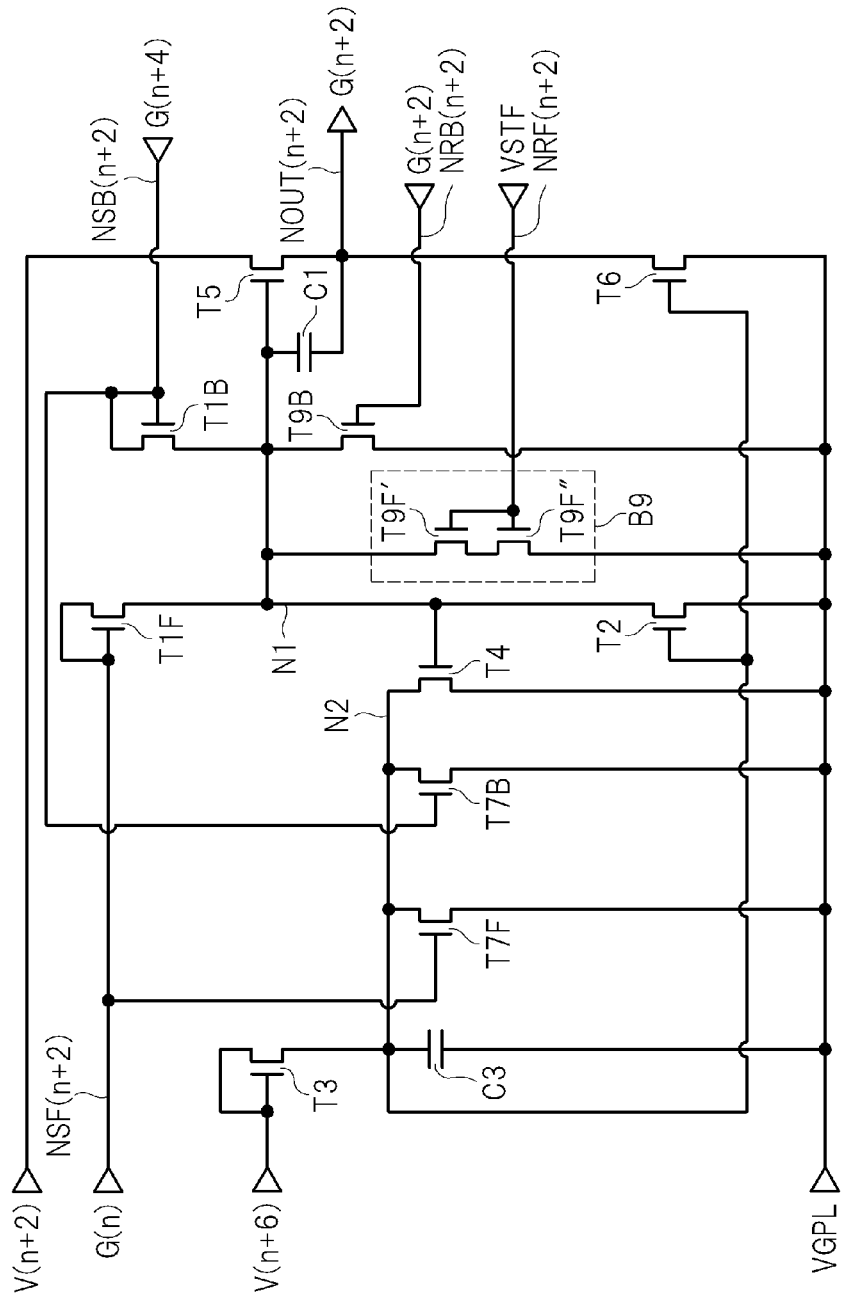
FIG. 12D is a circuit view of an (n+2)-th unit register circuit of the bidirectional shift register of embodiment 2.
Figure 12E:
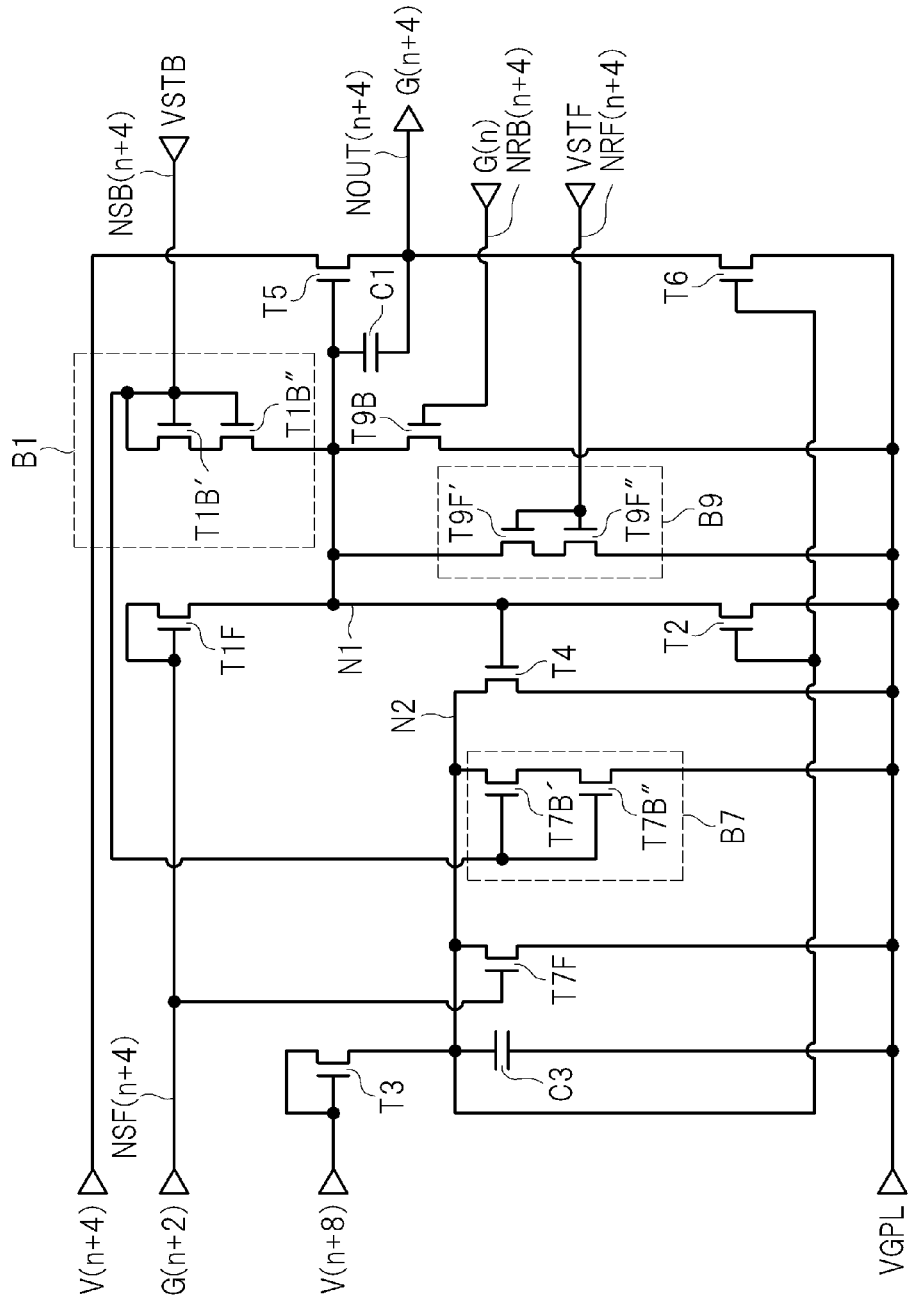
FIG. 12E is a circuit view of an (n+4)-th unit register circuit of the bidirectional shift register of embodiment 2.

FIG. 12A to FIG. 12E are circuit views each showing a unit register circuit 38 (on the side of a gate line drive circuit 14R) of a bidirectional shift register 30 of embodiment 2. FIG. 12A shows a unit register circuit 38 of a first stage, FIG. 12B shows a unit register circuit 38 of a third stage, FIG. 12C shows a unit register circuit 38 of an n-th stage (equal to FIG. 3), FIG. 12D shows a unit register circuit 38 of an (n+2)-th stage, and FIG. 12E shows a unit register circuit 38 of an (n+4)-th stage. As shown in FIG. 2, among these, the first stage and the third stage are the top dummy stages, the n-th stage is the last stage of the main stages, and the (n+2)-th and the (n+4)-th stages are the rear dummy stages.

The unit register circuit 38 of embodiment 2 is different from the unit register circuit 38 of embodiment 1 in that T1F and T7F of the first stage as the top dummy stage, T9B of the first and the third stage, T1B and T7B of the (n+4)-th stage as the rear dummy stage, and T9F of the (n+2)-th and the (n+4)-th stage as the rear dummy stage respectively have double-gate structures.

Figure 13:
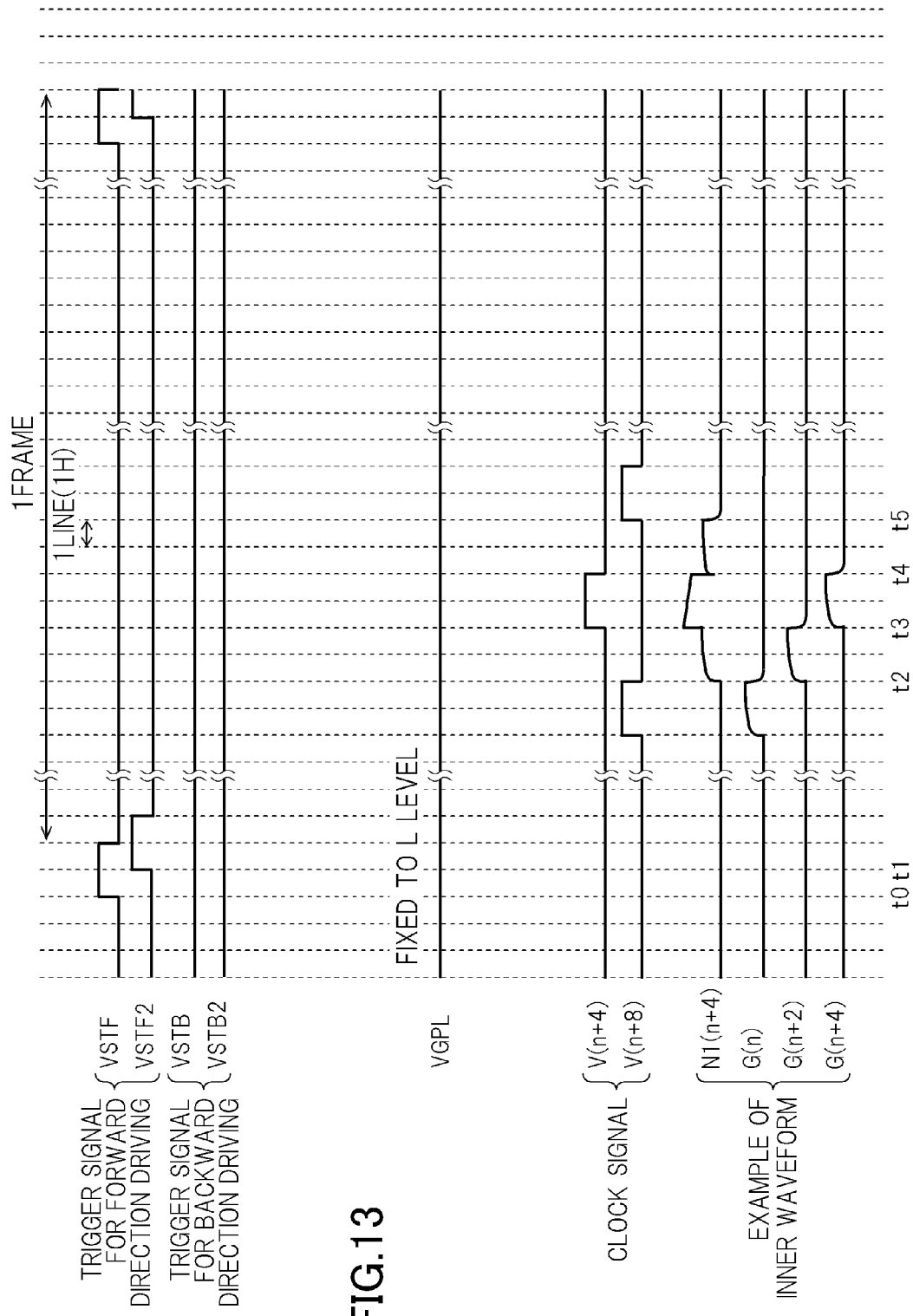
FIG. 13 is a timing view showing an example of various signal waveforms in a forward shift operation of the bidirectional shift register of embodiment 2.
Figure 14:
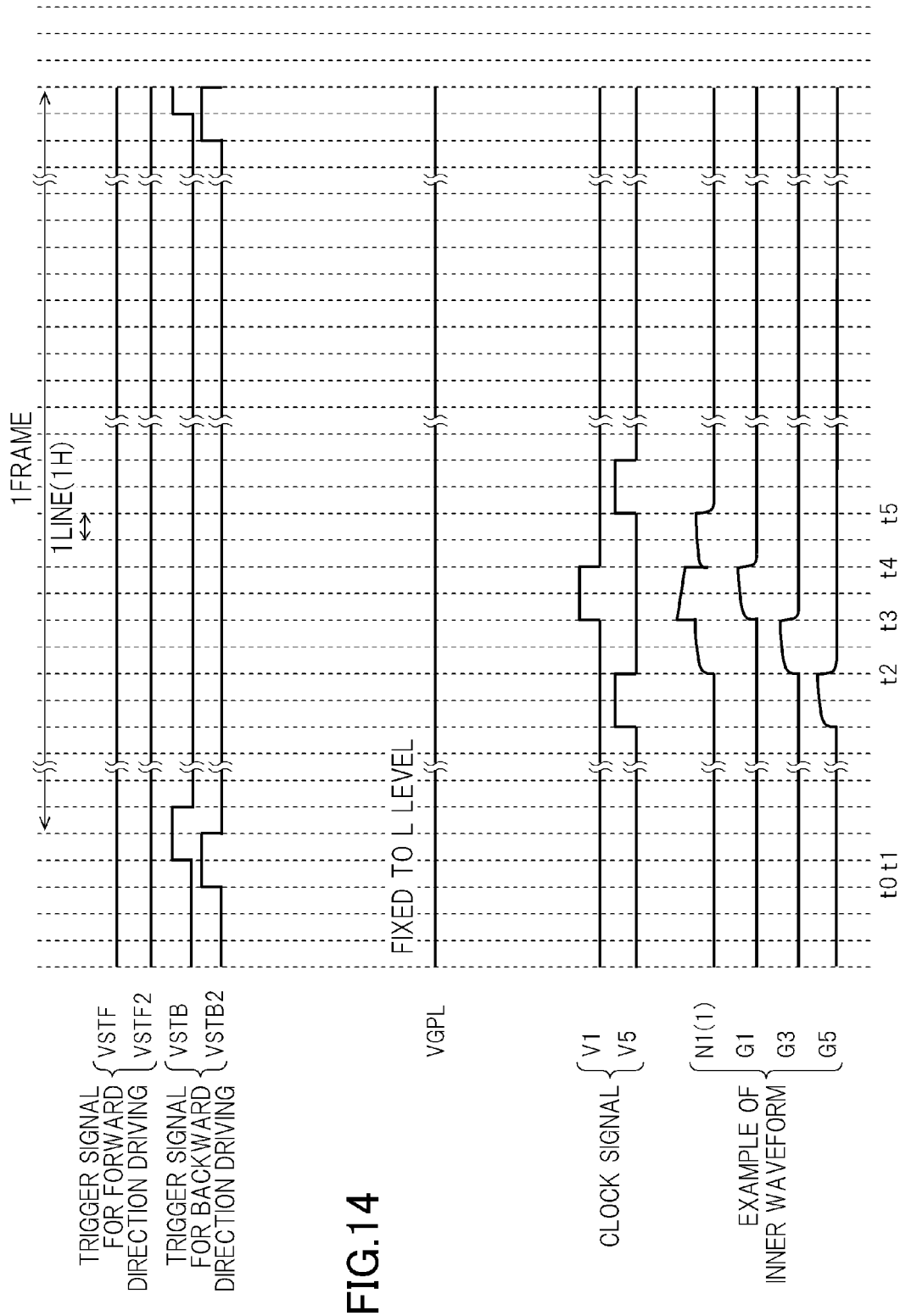
FIG. 14 is a timing view showing an example of various signal waveforms in a backward shift operation of the bidirectional shift register of embodiment 2.

In the case where the backward direction trigger signal VSTB is fixed to the L level in the forward shift repetition operation (see FIG. 13), if the double gate structure including T1B' and T1B" is adopted instead of T1B of the (n+4)-th stage, a potential at a node N3B to connect the source of T1B' and the drain of T1B" always becomes the L level. Accordingly, even if the threshold voltage of T1B" shifts in the negative direction, the threshold voltage of T1B' can be regarded as not shifting. By this, leakage of current through T1B' and T1B" can be suppressed. On the other hand, in the case where the forward direction trigger signal VSTF is fixed to the L level in the backward shift repetition operation (see FIG. 14), if the double gate structure including T1F' and T1F" is adopted instead of T1F of the first stage, a potential at a node N3F to connect the source of T1F' and the drain of T1F" always becomes the L level. Accordingly, even if the threshold voltage of T1F" shifts in the negative direction, the threshold voltage of T1F' can be regarded as not shifting. By this, leakage of current through T1F' and T1F" can be suppressed.

The reason why T7F of the first stage, T9B of the first and the third stage, T7B of the (n+4)-th stage, and T9F of the (n+2)-th and the (n+4)-th stage are respectively made to have the double gate structure is the same.

Figure 15A:
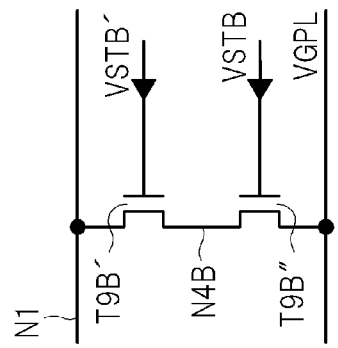
FIG. 15A is a view showing a modified example of a structure A1 shown in FIG. 12A.

FIG. 15A is a view showing a modified example of a structure A1 shown in FIG. 12A (first stage). FIG. 15A shows a structure in which T1F' and T1F" are series connected. Specifically, the source of T1F' and the drain of T1F" are connected at a node N3F, a reference point N1 is connected to the source of T1F", a forward direction trigger signal VSTF is inputted to the gate and the drain of T1F', and an auxiliary trigger signal VSTF' is inputted to the gate of T1F". The auxiliary trigger signal VSTF' not only rises to the H level at the time of start of the forward shift (similarly to the forward direction trigger signal VSTF), but also rises to the H level at the time of the backward shift operation at a predetermined timing (for example, a timing immediately after the first stage generates the output pulse). Thus, if the double gate structure A1 shown in FIG. 12A is replaced by the structure shown in FIG. 15A, even when the forward direction trigger signal VSTF is fixed to the L level in the backward shift repetition operation, the threshold voltage of T1F" shifts in the positive direction at the timing when the auxiliary trigger signal VSTF' rises to the H level. Accordingly, leakage of current through the series-connected T1F' and T1F" can be suppressed.

Figure 15B:
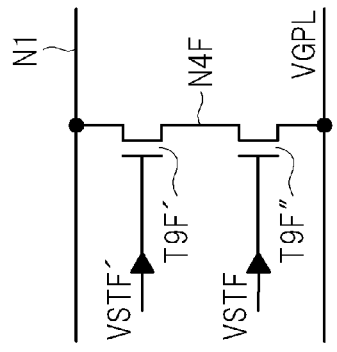
FIG. 15B is a view showing a modified example of a structure A9 shown in FIG. 12A and FIG. 12B.

FIG. 15B is a view showing a modified example of a structure A9 shown in FIG. 12A (first stage) and FIG. 12B (third stage). FIG. 15B shows a structure in which T9B' and T9B" are series connected. Specifically, the source of T9B' and the drain of T9B" are connected to each other at a node N4B, a reference point N1 is connected to the drain of T9B', a power source VGPL is connected to the source of T9B", an auxiliary trigger signal VSTB' is inputted to the gate of T9B', and a backward direction trigger signal VSTB is inputted to the gate of T9B". The auxiliary trigger signal VSTB' not only rises to the H level at the time of start of the backward shift (similarly to the backward direction trigger signal VSTB), but also rises to the H level at the time of the forward direction shift at a predetermined timing (for example, a timing immediately after the (n+4)-th stage generates the output pulse). Thus, if the double gate structure A9 shown in FIG. 12A and FIG. 12B is replaced by the structure shown in FIG. 15B, even when the backward direction trigger signal VSTB is fixed to the L level in the forward shift repetition operation, the threshold voltage of T9B' shifts in the positive direction at the timing when the auxiliary trigger signal VSTB' rises to the H level. Accordingly, leakage of current through the series-connected T9B' and T9B" can be suppressed.

Figure 15C:
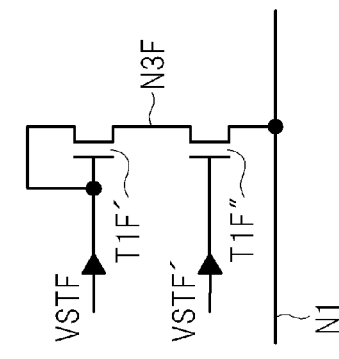
FIG. 15C is a view showing a modified example of a structure B1 shown in FIG. 12E.

FIG. 15C is a view showing a modified example of a structure B1 shown in FIG. 12E ((n+4)-th stage). FIG. 15C shows a structure in which T1B' and T1B" are series connected. Specifically, the source of T1B' and the drain of T1B" are connected to each other at a node N3B, a reference point N1 is connected to the source of T1B", a backward direction trigger signal VSTB is inputted to the gate and the drain of T1B', and an auxiliary trigger signal VSTB' is inputted to the gate of T1B". The auxiliary trigger signal VSTB' not only rises to the H level at the time of start of the backward shift (similarly to the backward direction trigger signal VSTB), but also rises to the H level at the time of the forward direction shift at a predetermined timing (for example, a timing immediately after the (n+4)-th stage generates the output pulse). Thus, if the double gate structure B1 shown in FIG. 12E is replaced by the structure shown in FIG. 15C, even when the backward direction trigger signal VSTB is fixed to the L level in the forward shift repetition operation, the threshold voltage of T1B" shifts in the positive direction at the timing when the auxiliary trigger signal VSTB' rises to the H level. Accordingly, leakage of current through the series-connected T1B' and T1B" can be suppressed.

Figure 15D:
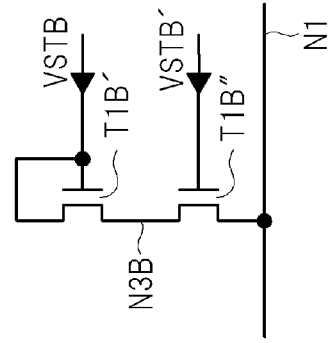
FIG. 15D is a view showing a modified example of a structure B9 shown in FIG. 12D and FIG. 12E.

FIG. 15D is a view showing a modified example of a structure B9 shown in FIG. 12D ((n+2)-th stage) and FIG. 12E ((n+4)-th stage). FIG. 15D shows a structure in which T9F' and T9F" are series connected. Specifically, the source of T9F' and the drain of T9F" are connected to each other at a node N4F, a reference point N1 is connected to the drain of T9F', a power source VGPL is connected to the source of T9F", an auxiliary trigger signal VSTF' is inputted to the gate of T9F', and a forward direction trigger signal VSTF is inputted to the gate of T9F". The auxiliary trigger signal VSTF' not only rises to the H level at the time of start of the forward shift (similarly to the forward direction trigger signal VSTF), but also rises to the H level at the time of the backward shift operation at a predetermined timing (for example, a timing immediately after the first stage generates the output pulse). Thus, if the double gate structure B9 shown in FIG. 12D and FIG. 12E is replaced by the structure shown in FIG. 15D, even when the forward direction trigger signal VSTF is fixed to the L level in the backward shift repetition operation, the threshold voltage of T9F' shifts in the positive direction at the timing when the auxiliary trigger signal VSTF' rises to the H level. Accordingly, leakage of current through the series-connected T9F' and T9F" can be suppressed.

Figure 16A:
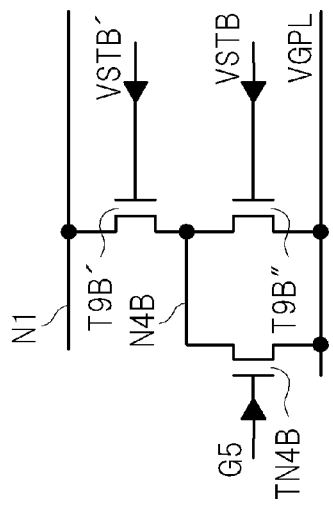
FIG. 16A is a view showing a modified example of a structure shown in FIG. 15A.

FIG. 16A is a view showing a modified example of the structure shown in FIG. 15A. FIG. 16A shows a structure in which a node N3F is connected to a power source VGPL through a transistor TN3F. The drain of TN3F is connected to the node N3F, the source thereof is connected to the power source VGPL, an output signal G5 of the fifth stage is inputted to the gate, and TN3F is turned on in response to the pulse outputted from the fifth stage and reduces the potential at the node N3F to the L level. Thus, if the double gate structure A1 shown in FIG. 12A is replaced by the structure shown in FIG. 16A, leakage of current through the series-connected T1F' and T1F" can be more certainly suppressed.

Figure 16B:
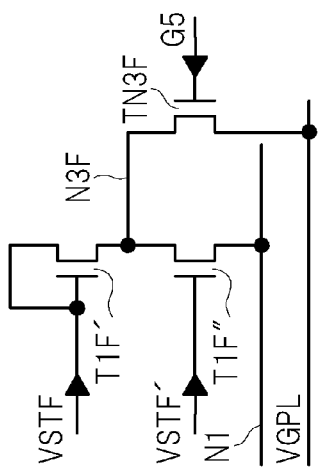
FIG. 16B is a view showing a modified example of a structure shown in FIG. 15B.

FIG. 16B is a view showing a modified example of the structure shown in FIG. 15B. FIG. 16B shows a structure in which a node N4B is connected to a power source VGPL through a transistor TN4B. The drain of TN4B is connected to the node N4B, the source thereof is connected to the power source VGPL, an output signal G5 of the fifth stage is inputted to the gate, and TN4B is turned on in response to the pulse outputted from the fifth stage and reduces the potential at the node N4B to the L level. Thus, if the double gate structure A9 shown in FIG. 12A and FIG. 12B is replaced by the structure shown in FIG. 16B, leakage of current through the series-connected T9B' and T9B" can be more certainly suppressed.

Figure 16C:
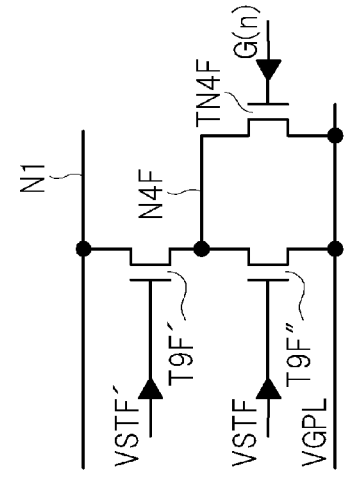
FIG. 16C is a view showing a modified example of a structure shown in FIG. 15C.

FIG. 16C is a view showing a modified example of the structure shown in FIG. 15C. FIG. 16C shows a structure in which a node N3B is connected to a power source VGPL through a transistor TN3B. The drain of TN3B is connected to the node N3B, the source thereof is connected to the power source VGPL, an output signal G(n) of the n-th stage is inputted to the gate, and TN3B is turned on in response to the pulse outputted from the n-th stage and reduces the potential at the node N3B to the L level. Thus, if the double gate structure B1 shown in FIG. 12E is replaced by the structure shown in FIG. 16C, leakage of current through the series-connected T1B' and T1B" can be more certainly suppressed.

Figure 16D:
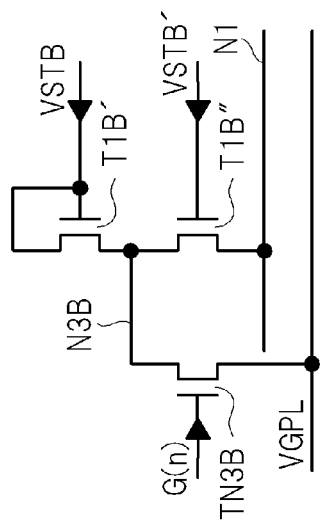
FIG. 16D is a view showing a modified example of a structure shown in FIG. 15D.
Figure 17:
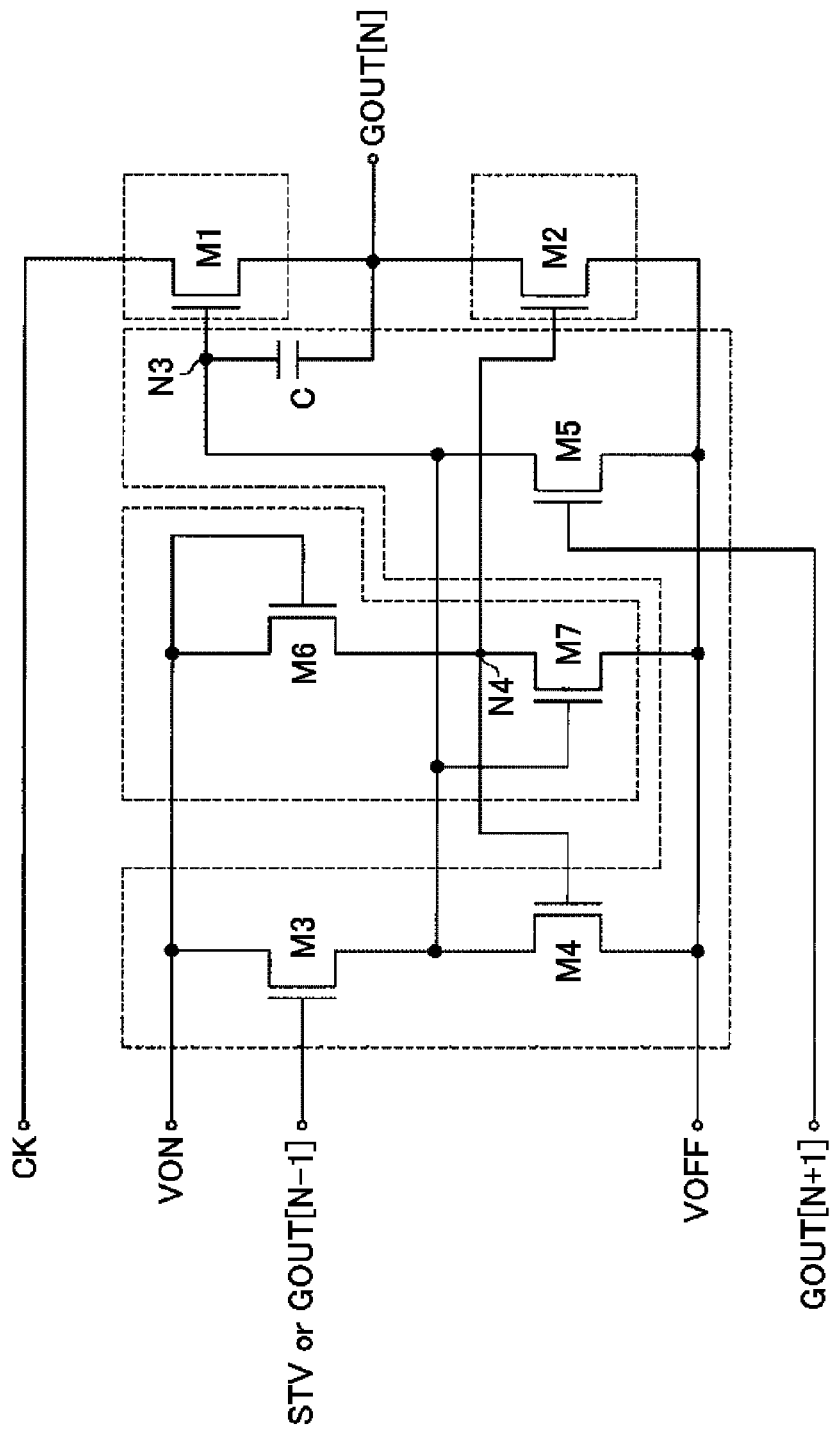
FIG. 17 is a circuit view showing a structure of a related art unit register circuit.
Figure 18:
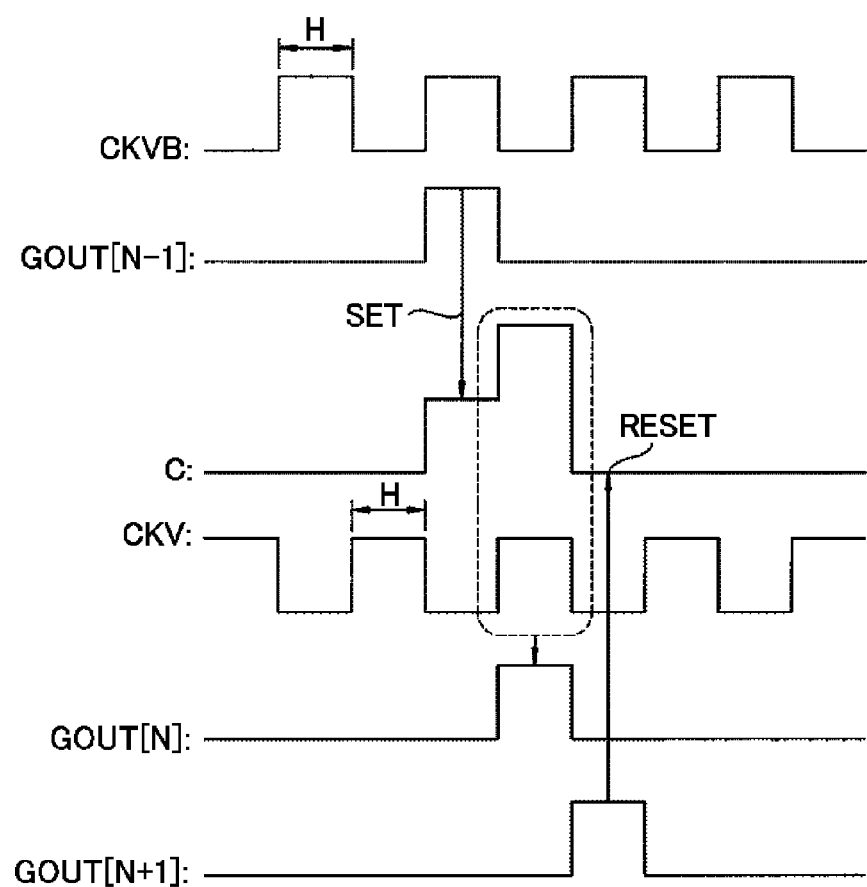
FIG. 18 is a signal waveform view for explaining the operation of the related art unit register circuit.

FIG. 16D is a view showing a modified example of the structure shown in FIG. 15D. FIG. 16D shows a structure in which a node N4F is connected to a power source VGPL through a transistor TN4F. The drain of TN4F is connected to the node N4F, the source thereof is connected to the power source VGPL, an output signal G(n) of the n-th stage is inputted to the gate, and TN4F is turned on in response to the pulse outputted from the n-th stage and reduces the potential at the node N4F to the L level. Thus, if the double gate structure B9 shown in FIG. 12D and FIG. 12E is replaced by the structure shown in FIG. 16D, leakage of current through the series-connected T9F' and T9F" can be more certainly suppressed.

Incidentally, the double gate structures and the modified examples thereof as described above are effective not only in the case where the forward direction trigger signal VSTF and the backward direction trigger signal VSTB are fixed to the L level, but also in the case where the forward direction trigger signal VSTF and the backward direction VSTB are changed to the H level in the vertical blanking interval as in embodiment 1 (see FIG. 6 to FIG. 11). Besides, the transistors TN3F, TN3B, TN4F and TN4B can be replaced by switch elements which are turned on in response to the pulse or the clock pulse outputted from another stage. Besides, a modified example similar to the above can be applied also to T7F of FIG. 12A (first stage) and T7B of FIG. 12E ((n+4)-th stage).

In the above, the structure of the gate line drive circuit 14 is described while the right gate line drive circuit 14R to drive the gate signal lines 20 of odd rows is used as an example. The structure of the left gate line drive circuit 14L to drive the gate signal lines 20 of even rows is the same as that on the right side.

Incidentally, various modifications of the structure described in embodiment 1 can be adopted also in the bidirectional shift register of the embodiment.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A bidirectional shift register comprising:
a shift register part that includes N (N is an integer of 6 or more) cascade-connected unit register circuits and outputs an output pulse G(k) of a k-th unit register circuit (k for all integers of 1≤k≤N) in a shift sequence of one of a forward direction and a backward direction;
a clock signal generation part that supplies M-phase (M is an integer of 3 or more) clock pulses to the respective unit register circuits of the shift register part sequentially in the forward direction at a time of a forward shift operation of the shift register part or sequentially in the backward direction at a time of a backward shift operation; and
a trigger signal generation part that generates a forward direction trigger signal which is a pulse which rises to High level at a time of start of the forward shift and in a vertical blanking interval of the backward shift, and generates a backward direction trigger signal which is a pulse which rises to High level at a time of start of the backward shift and in a vertical blanking interval of the forward shift, wherein
the k-th unit register circuit includes a forward direction set terminal, a backward direction set terminal, a forward direction reset terminal, a backward direction reset terminal, a set circuit to set a potential at a reference point to a first potential when a set signal is inputted to one of the set terminals, a reset circuit, being separated from the set circuit to set the potential at the reference point to a second potential when a reset signal is inputted to one of the reset terminals, and an output circuit to output the output pulse G(k) in synchronization with the inputted clock pulse in a state where the reference point is at the first potential,
when αf is an integer of one or more, αb is an integer of one or more, βf is an integer of two or more, and βb is an integer of two or more, and αf<βb<M and αb<βf<M are established,
the k-th unit register circuits for k≤βb and k>N−βf are dummy register circuits,
in a first case that k>αf for the forward shift operation, in the set circuit of the k-th unit register circuit, an output pulse G(k−αf) (k>αf) is inputted as the set signal to the forward direction set terminal,
in a second case that k≤αf for the forward shift operation, in the set circuit of the k-th unit register circuit, the forward direction trigger signal is inputted as the set signal to the forward direction set terminal,
in a third case that k≤N−αb for the backward shift operation, in the set circuit of the k-th unit register circuit, an output pulse G(k+αb) is inputted as the set signal to the backward direction set terminal,
in a fourth case that k>N-ab for the backward shift operation, in the set circuit of the k-th unit register circuit, the backward direction trigger signal is inputted as the set signal to the backward direction set terminal,
in a fifth case that k≤N−βf for the forward shift operation, in the reset circuit of the k-th unit register circuit, an output pulse G(k+βf) is inputted as the reset signal to the forward direction reset terminal,
in a sixth case that k>N−βf for the forward shift operation, in the reset circuit of the k-th unit register circuit, the forward direction trigger signal is inputted as the reset signal to the forward direction reset terminal, and in the set circuit of the k-th unit register circuit, the backward direction trigger signal is inputted to the backward direction set terminal after the output circuit of the k-th unit register circuit output the output pulse G(k),
in a seventh case that k>βb for the backward shift operation, in the reset circuit of the k-th unit register circuit, an output pulse G(k−βb) is inputted as the reset signal to the backward direction reset terminal, and
in an eighth case that k≤βb for the backward shift operation, in the reset circuit of the k-th unit register circuit, the backward direction trigger signal is inputted as the reset signal to the backward direction reset terminal, and in the set circuit of the k-th unit register circuit, the forward direction trigger signal is inputted to the forward direction set terminal after the output circuit of the k-th unit register circuit output the output pulse G(k).

2. The bidirectional shift register according to claim 1, wherein the trigger signal generation part generates the backward direction trigger signal in a period of βf-phase clocks immediately after the output pulse G(N) is outputted at the time of the forward shift operation, and generates the forward direction trigger signal in a period of βb-phase clocks immediately after the output pulse G(1) is outputted at the time of the backward shift operation.

3. The bidirectional shift register according to claim 1, wherein the trigger signal generation part generates the backward direction trigger signal in a period of αf-phase clocks immediately before the output pulse G(N) is outputted at the time of the forward shift operation, and generates the forward direction trigger signal in a period of ab-phase clocks immediately before the output pulse G(1) is outputted at the time of the backward shift operation.

4. The bidirectional shift register according to claim 1, wherein a potential of the forward direction trigger signal and a potential of the backward direction trigger signal are higher than a potential of the clock pulse.

5. The bidirectional shift register according to claim 1, wherein
the set circuit of the k-th unit register circuit includes a first forward direction switch that is turned on when the set signal is inputted to the forward direction set terminal and sets the potential at the reference point to the first potential, and a first backward direction switch that is turned on when the set signal is inputted to the backward direction set terminal and sets the potential at the reference point to the first potential, and
the reset circuit of the k-th unit register circuit includes a second forward direction switch that is turned on when the reset signal is inputted to the forward direction reset terminal and sets the potential at the reference point to the second potential, and a second backward direction switch that is turned on when the reset signal is inputted to the backward direction reset terminal and sets the potential at the reference point to the second potential.

6. The bidirectional shift register according to claim 5, wherein
the first forward direction switch included in the set circuit of the first unit register circuit to the $\alpha f$-th unit register circuit is a double-gate structure transistor in which a gate terminal is connected to the forward direction set terminal,
the second backward direction switch included in the reset circuit of the first unit register circuit to the $\beta b$-th unit register circuit is a double-gate structure transistor in which a gate terminal is connected to the backward direction reset terminal,
the first backward direction switch included in the set circuit of the $(N-\alpha b+1)$-th unit register circuit to the N-th unit register circuit is a double-gate structure transistor in which a gate terminal is connected to the backward direction set terminal, and
the second forward direction switch included in the reset circuit of the $(N-\beta f+1)$-th unit register circuit to the N-th unit register circuit is a double-gate structure transistor in which a gate terminal is connected to the forward direction reset terminal.

7. The bidirectional shift register according to claim 5, wherein
the trigger signal generation part generates a forward direction auxiliary trigger signal at the time of start of the forward shift and a predetermined timing at the time of the backward shift operation, and generates a backward auxiliary trigger signal at the time of start of the backward shift and a predetermined timing at the time of the forward shift operation,
the first forward direction switch included in the set circuit of the first unit register circuit to the $\alpha f$-th unit register circuit includes a first forward direction set transistor in which a gate terminal and a drain terminal are connected to the forward direction set terminal, and a second forward direction set transistor in which the forward direction auxiliary trigger signal is inputted to a gate terminal, a drain terminal is connected to a source terminal of the first forward direction set transistor, and a source terminal is connected to the reference point,
the second backward direction switch included in the reset circuit of the first unit register circuit to the $\beta b$-th unit register circuit includes a first backward direction reset transistor in which the backward direction auxiliary trigger signal is inputted to a gate terminal, and a drain terminal is connected to the reference point, and a second backward direction reset transistor in which a gate terminal is connected to the backward direction reset terminal, a drain terminal is connected to a source terminal of the first backward direction reset transistor, and a source terminal is connected to a power source of the second potential,
the first backward direction switch included in the set circuit of the $(N-\alpha b+1)$-th unit register circuit to the N-th unit register circuit includes a first backward direction set transistor in which a gate terminal and a drain terminal are connected to the backward direction set terminal, and a second backward direction set transistor in which the backward direction auxiliary trigger signal is inputted to a gate terminal, a drain terminal is connected to a source terminal of the first backward direction set transistor, and a source terminal is connected to the reference point, and
the second forward direction switch included in the reset circuit of the $(N-\beta f+1)$-th unit register circuit to the N-th unit register circuit includes a first forward direction reset transistor in which the forward direction auxiliary trigger signal is inputted to a gate terminal, and a drain terminal is connected to the reference point, and a second forward direction reset transistor in which a gate terminal is connected to the forward direction reset terminal, a drain terminal is connected to a source terminal of the first forward direction reset transistor, and a source terminal is connected to the power source of the second potential.

8. The bidirectional shift register according to claim 7, wherein
the first forward direction switch included in the set circuit of the first unit register circuit to the $\alpha f$-th unit register circuit further includes a switch to set a potential at a node, at which the source terminal of the first forward direction set transistor and the drain terminal of the second forward direction set transistor are connected, to the second potential in response to an output pulse of another unit register circuit,
the second backward direction switch included in the reset circuit of the first unit register circuit to the $\beta b$-th unit register circuit further includes a switch to set a potential at a node, at which the source terminal of the first backward direction reset transistor and the drain terminal of the second backward direction reset transistor are connected, to the second potential in response to an output pulse of another unit register circuit,
the first backward direction switch included in the $(N-\alpha b+1)$-th unit register circuit to the N-th unit register circuit further includes a switch to set a potential at a node, at which the source terminal of the first backward direction set transistor and the drain terminal of the second backward direction set transistor are connected, to the second potential in response to an output pulse of another unit register circuit, and
the second forward direction switch included in the reset circuit of the $(N-\beta f+1)$-th unit register circuit to the N-th unit register circuit further includes a switch to set a potential at a node, at which the source terminal of the first forward direction reset transistor and the drain terminal of the second forward direction reset transistor are connected, to the second potential in response to an output pulse of another unit register circuit.

9. An image display device comprising:
a plurality of pixel circuits arranged in a matrix form correspondingly to a plurality of scanning lines;
a plurality of gate signal lines that are provided for the respective scanning lines and supply gate signals to control writing of video data to the pixel circuits; and
a gate signal line drive circuit that uses the bidirectional shift register according to any one of claims 1 to 8, and generates the gate signal to each of the plurality of gate signal lines based on the output pulse outputted from a unit register circuit correlated with the gate signal line among the plurality of unit register circuits of the shift register part.

\* \* \* \* \*